(12) United States Patent
Cheng et al.

(10) Patent No.: US 6,582,496 B1
(45) Date of Patent: Jun. 24, 2003

(54) HOLLOW FIBER MEMBRANE CONTACTOR

(75) Inventors: Kwok-Shun Cheng, Nashua, NH (US); Cha P. Doh, Sudbury, MA (US)

(73) Assignee: Mykrolis Corporation, Billerica, MA (US)

( * ) Notice: Subject to any disclaimer, the term of this patent is extended or adjusted under 35 U.S.C. 154(b) by 0 days.

(21) Appl. No.: 09/889,960

(22) PCT Filed: Jan. 28, 2000

(86) PCT No.: PCT/US00/02378

§ 371 (c)(1),
(2), (4) Date: Jul. 24, 2001

(87) PCT Pub. No.: WO00/44479

PCT Pub. Date: Aug. 3, 2000

(51) Int. Cl.⁷ .............................................. B01D 53/22
(52) U.S. Cl. .......................... 95/46; 95/45; 96/6; 96/8; 96/14
(58) Field of Search .............................. 95/45, 46; 96/6, 96/8, 10, 14

(56) References Cited

U.S. PATENT DOCUMENTS

| | | | |
|---|---|---|---|
| 4,902,456 A | 2/1990 | Yen et al. | |
| 4,906,377 A | 3/1990 | Yen et al. | |
| 4,990,294 A | 2/1991 | Yen et al. | |
| 5,032,274 A | 7/1991 | Yen et al. | |
| 5,154,827 A | 10/1992 | Ashelin et al. | |
| 5,158,680 A | 10/1992 | Kawai et al. | |
| 5,211,728 A * | 5/1993 | Trimmer | 95/46 X |
| 5,282,964 A * | 2/1994 | Young et al. | 95/45 X |
| 5,490,931 A | 2/1996 | Chung et al. | |
| 5,626,769 A * | 5/1997 | Sawamoto | 95/46 X |
| 5,695,702 A | 12/1997 | Niermeyer | |
| 5,762,684 A * | 6/1998 | Hayashi et al. | 95/46 X |
| 5,762,789 A | 6/1998 | de los Reyes et al. | |
| 5,855,783 A | 1/1999 | Shucosky et al. | |
| 6,168,648 B1 * | 1/2001 | Ootani et al. | 95/46 |
| 6,217,634 B1 * | 4/2001 | Dominelli et al. | 95/46 |
| 6,290,756 B1 * | 9/2001 | Macheras et al. | 96/8 |
| 6,309,444 B1 * | 10/2001 | Sims et al. | 95/46 |

FOREIGN PATENT DOCUMENTS

| | | |
|---|---|---|
| DE | 3444387 | 7/1985 |
| EP | 0 175 432 | 3/1986 |
| EP | 0 217 482 | 4/1987 |
| EP | 0 299 459 | 1/1989 |
| EP | 0 340 732 | 11/1989 |
| EP | 0 343 247 | 11/1989 |
| EP | 0 559 149 | 9/1993 |
| EP | 0 803 281 | 10/1997 |
| EP | 0 855 212 | 7/1998 |
| FR | 2566003 | 12/1985 |
| WO | WO 00/44479 | 8/2000 |
| WO | WO 00/44480 | 8/2000 |
| WO | WO 00/44482 | 8/2000 |
| WO | WO 00/44483 | 8/2000 |
| WO | WO 00/44484 | 8/2000 |
| WO | WO 00/44485 | 8/2000 |

OTHER PUBLICATIONS

Derwent Publication XP–002142276 Abstract of JP 04 354521.

* cited by examiner

Primary Examiner—Robert H. Spitzer
(74) Attorney, Agent, or Firm—Mykrolis Corporation; Timothy J. King; Paul J. Cook

(57) ABSTRACT

A fully perfluorinated thermoplastic hollow fiber membrane fluid-fluid contactor and a process for manufacturing the contactor is described. The contactor has a unitary end structure produced by a single step potting and bonding process. The contactor can be operated with low surface tension liquids and in harsh chemical environments.

107 Claims, 5 Drawing Sheets

HOLLOW FIBER MEMBRANE CONTACTOR

FIELD OF THE INVENTION

This invention relates to a hollow fiber membrane contactor for phase separations and other phase contact applications. The contactor is made from perfluorinated thermoplastic polymeric materials, has a high packing density providing high useful contacting area, and the ability to operate with liquids of low surface tension.

BACKGROUND OF THE INVENTION

Liquid-gas contactors are used to transfer one or more soluble substances from one phase to another. Examples of conventional contactors are packed towers, plate columns and wetted wall columns. In these systems, gas absorption of one or more components from the gas stream is accomplished by dispersing the gas as bubbles in packed towers and plate columns in a countercurrent flow to the liquid stream. Absorption efficiency is controlled apart from solubility considerations by the relative rate of the flows and the effective surface area of the gas flow bubbles. In wetted wall contactors the gas stream flows past a downward flow of liquid on the inside wall of a vertical tube. Gas stripping is used to transfer a gas dissolved in liquid into a gas stream. Similar contactors are used for gas stripping.

Conventional contactors have several deficiencies. Primary among these is the fact that the individual gas and liquid flows cannot be varied independently over wide ranges. Tray columns are prone to such problems as weeping at low gas flows and flooding at high liquid flows. Packed towers can flood at high flow rates. The use of low liquid flow rates In a packed tower would lead to channeling and reduced effective surface area. Excessive frothing or foam formation can lead to process inefficiency. Wetted wall contactors have inherently low mass transfer coefficients, and can flood at high gas flow rates. The development of membrane contactors has overcome these deficiencies.

Membrane contactors are devices through which two fluid phases flow separated by a membrane permeable to the gas being transferred. If a microporous membrane is being used, the preferred method relies on the non-wetting characteristic of the membrane material and the pore size to prevent liquid from intruding into the pores and filling them. Gas transfer then occurs through the gas filled pores to or from the liquid, depending on whether the process is absorption or stripping. If a non-porous membrane is used, gas transfer is controlled by the diffusion rate in the non-porous layer of the membrane. In some cases, such as oxygen removal from ultrapure water, gas stripping is done with a vacuum instead of a stripping gas flow. While other membrane geometries are available for this use, hollow fiber membranes are suited as contactors.

A hollow fiber porous membrane is a tubular filament comprising an outer diameter, an inner diameter, with a porous wall thickness between them. The inner diameter defines the hollow portion of the fiber and is used to carry one of the fluids. For what is termed tube side contacting, the liquid phase flows through the hollow portion, sometimes called the lumen, and is maintained separate from the gas phase, which surrounds the fiber. In shell side contacting, the liquid phase surrounds the outer diameter and surface of the fibers and the gas phase flows through the lumen.

The outer or inner surface of a hollow fiber membrane can be skinned or unskinned. A skin is a thin dense surface layer integral with the substructure of the membrane. In skinned membranes, the major portion of resistance to flow through the membrane resides in the thin skin. The surface skin may contain pores leading to the continuous porous structure of the substructure, or may be a non-porous integral film-like surface. In porous skinned membranes, permeation occurs primarily by connective flow through the pores. Asymmetric refers to the uniformity of the pore size across the thickness of the membrane; for hollow fibers, this is the porous wall of the fiber. Asymmetric membranes have a structure in which the pore size is a function of location through the cross-section, typically, gradually increasing in size in traversing from one surface to the opposing surface. Another manner of defining asymmetry is the ratio of pore sizes on one surface to those on the opposite surface.

Manufacturers produce membranes from a variety of materials, the most general class being synthetic polymers. An important class of synthetic polymers are thermoplastic polymers, which can be flowed and molded when heated and recover their original solid properties when cooled. As the conditions of the application to which the membrane is being used become more severe, the materials that can be used become limited. For example, the organic solvent-based solutions used for wafer coating in the microelectronics industry will dissolve or swell and weaken most common polymeric membranes. The high temperature stripping baths in the same industry consist of highly acid and oxidative compounds, which will destroy membranes made of common polymers. Perfluorinated thermoplastic polymers such as poly(tetrafluoroethylene-co-perfluoro(alkylvinylether)) (poly(PTFE-CO-PFVAE)) or poly(tetrafluoroethylene-co-hexafluoropropylene) (FEP) are not adversely affected by severe conditions of use, so that membranes made from these polymers would have a decided advantage over ultrafiltration membranes made from less chemically and thermally stable polymers. These thermoplastic polymers have advantages over (poly(tetrafluoroethylene) (PTFE), which is not a thermoplastic, in that they can be molded or shaped in standard type processes, such as extrusion. Perfluorinated thermoplastic hollow fiber membranes can be produced at smaller diameters than possible with PTFE. Fibers with smaller diameters, for example, in the range of about 350 micron outer diameter to about 1450 micron outer diameter, can be fabricated into contactors having high membrane surface area to contactor volume ratios. This attribute is useful for producing compact equipment, which are useful in applications where space is at a premium, such as in semiconductor manufacturing plants.

Being chemically inert, the Poly (PTFE-CO-PFVAE) and FEP polymers are difficult to form into membranes using typical solution casting methods as they are difficult to dissolve in the normal solvents. They can be made into membranes using the Thermally Induced Phase Separation (TIPS) process. In one example of the TIPS process a polymer and organic liquid are mixed and heated in an extruder to a temperature at which the polymer dissolves. A membrane is shaped by extrusion through an extrusion die, and the extruded membrane is cooled to form a gel. During cooling the polymer solution temperature is reduced to below the upper critical solution temperature. This is the temperature at or below which two phases form from the homogeneous heated solution, one phase primarily polymer, the other primarily solvent. If done properly, the solvent rich phase forms a continuous interconnecting porosity. The solvent rich phase is then extracted and the membrane dried.

Hydrophobic microporous membranes are commonly used for contactor applications with an aqueous solution that does not wet the membrane. The solution flows on one side of the membrane and a gas mixture preferably at a lower pressure than the solution flows on the other. Pressures on each side of the membrane are maintained so that the liquid pressure does not overcome the critical pressure of the membrane, and so that the gas does not bubble into the liquid. Critical pressure, the pressure at which the solution will intrude into the pores, depends directly on the material used to make the membrane, inversely on the pore size of the membrane, and directly on the surface tension of the liquid in contact with the gas phase. Hollow fiber membranes are primarily used because of the ability to obtain a very high packing density with such devices. Packing density relates to the amount of useful membrane surface per volume of the device. It is related to the number of fibers that can be potted in a finished contactor. Also, contactors may be operated with the feed contacting the inside or the outside surface, depending on which is more advantageous in the particular application. Typical applications for contacting membrane systems are to remove dissolved gases from liquids, "degassing"; or to add a gaseous substance to a liquid. For example, ozone is added to very pure water to wash semiconductor wafers.

Porous contactor membranes are preferred for many applications because they will have higher mass transfer than nonporous membranes. For applications with liquids having low surface tensions, smaller pore sizes will be able to operate at higher pressures due to their resistance to intrusion. Non-porous contactor membranes are preferred in cases where the liquid vapor pressure is high, or where high temperature operation increases the vapor pressure. In these cases, evaporation through a porous membrane may result in substantial liquid loss. Non-porous membranes may also be preferred in high-pressure applications, where intrusion of a porous membrane would be a problem.

Membrane contactors can also be useful in applications where in addition to phase transfer of a species from a feed stream to a second phase, a chemical reaction is desired between that species and a second reactant in the second phase. Membrane contactors would provide high surface area for mass transfer and maintain the product separate from the feed stream.

Z. Qi and E. L. Cussler (J. Membrane Sci. 23(1985) 333–345) show that membrane resistance controls absorption of gases such as ammonia, $SO_2$ and $H_2S$ in sodium hydroxide solutions. This seems generally true for contactors used with strong acids and bases as the absorption liquid. For these applications, a more porous contactor membrane, such as a microporous membrane, would have an advantage, because the membrane resistance would be reduced. This would be practical if the liquid does not intrude the pores and increase resistance. With the very low surface tension materials used in the present invention, this would be possible without coating the surface of the fibers with a low surface tension material, which is an added and complex manufacturing process step.

Membrane contactors have several advantages over conventional equipment. Membrane contactors have a higher surface area per unit volume than conventional packed towers. More importantly, membrane contactors are not disturbed by high or low flow rates and do not suffer from the problems set forth above for conventional contactors. This is due to the fact that in membrane contactors, the flow rates can be controlled independently because the separate phases are not in physical contact and cannot influence each others flow. Membrane contactors also have the advantage that bubbles are not formed in the liquid stream under proper operating conditions. These advantages are useful in important applications.

Ozone treatment of drinking water is being increasingly considered. Ozone has the capability of eliminating all viruses, and does not form substances such as trihalomethanes, which are by-products of chlorine treatment and natural substances such as humic or fulvic acids which may be present. For applications requiring a compact apparatus, such as at remote sites, the higher efficiency of a membrane contactor would be preferable to the typical small bubble diffuser, which requires significant water-ozone depth to be effective.

In the manufacturing process for integrated circuits, a photoresist coating is baked onto a silicon wafer that must be removed after processing. Oxidation is a commonly used method to clean the wafers.

U.S. Pat. No. 5,082,518 describes a sulfuric acid and oxidizer process to clean semiconductor wafers. A gas distribution system comprising a sparger plate with diffusion holes distributes ozone directly into a treatment tank containing sulfuric acid. This system has the disadvantages of lower absorption efficiency of ozone absorption into the water due to the large bubbles of ozone produced. The contactor of the present invention has the chemical stability to operate directly in harsh environments and would improve cleaning reaction efficiency by supplying a bubble free ozone solution.

Ohmi et al, J. Electrochem. Soc., Vol. 140, No. 3, March 1993, pp. 804–810, describe cleaning organic impurities from silicon wafers at room temperature with ozone-injected ultrapure water. U.S. Pat. No. 5,464,480 shows that ozone diffused through a subambient temperature deionized water will quickly and effectively remove organic materials such as photoresist from wafers without the use of other chemicals. It is believed that lowering the temperature of the solution enables a sufficiently high ozone concentration in solution to substantially oxidize all of the organic material on the wafer to insoluble gases. The means for diffusing a gas can be any means which provides fine bubbles of ozone or other gases into the tank and uniformly distributes the gas throughout the tank.

In U.S. Pat. No. 5,464,480, preferably, the bubbles that are provided by the diffuser are initially about 25 to about 40 microns in diameter. The gas diffuser preferably is made from a mixture of polytetrafluoroethylene (PTFE) and perfluoroalkoxylvinylether. By varying the temperature and pressure under which the mixture is prepared by methods known in the art, both porous and nonporous members are formed. The impermeable and permeable members are preferably comprised of about 95% PTFE and about 5% perfluoroalkoxylvinylether. The permeable member and the impermeable member may be joined by any number of methods as long as the result is a composite member that will not come apart under the stresses in the tank. Preferably, the members are heat sealed together, essentially melting or fusing the members together using carbon-carbon bonds. Once the permeable member is formed, a trench is bored out of the PTFE in the top portion of the member. The resulting diffuser has on the order of about 100,000 pores of a size of about 25 to about 40 microns in diameter through which gas may permeate into the treatment tank. The use of the trench in the diffuser allows the gas to diffuse into the tank as very fine bubbles. In applications for the semiconductor manufacturing industry, a device that supplied homogeneous bubble free ozone dissolved in ultrapure water would provide more efficient oxidation reactions because the reaction would not be localized at the bubbles. The more homogeneous solution would provide for a more uniform cleaning reaction. Furthermore, the high surface area to volume ratio inherent in hollow fiber devices would give a compact system, suitable for semiconductor operations.

Dissolved oxygen in ultrapure water is another problem in semiconductor device manufacturing. Oxygen removal to less than one part per billion (ppb) is required to prevent uncontrolled oxide growth. Potential problems associated with uncontrolled oxide growth are prevention of low temperature epitaxy growth, reduction of precise control of gate-oxide films, and increased contact resistance for VIA holes. This uncontrolled growth can be overcome by stripping dissolved oxygen to less than 1 ppb from the ultrapure water used in the manufacturing process. The high packing density and cleanliness associated with an all perfluorinated thermoplastic contactor are advantages in such applications.

U.S. Pat. No. 5,670,094 provides an oxidized water producing method in which a pressurized ozone gas generated by an electric discharge type ozonator is dissolved in water to be treated through a hollow fiber membrane, characterized in that the water pressure inside the membrane is maintained higher than the pressure of the ozone gas supplied to the outside of the hollow fiber membrane to prevent tiny bubbles and impurities from getting mixed into the water being treated, and the ozone concentration in the treated water is controlled on the basis of the concentration of the ozone gas. This method reference discloses only PTFE membranes and does not contemplate the use of an all perfluorinated thermoplastic contactor.

Commercially available all PTFE hollow tube contactors are referred to as "hollow tubes", probably because they are relatively large. Patent JP7213880A discloses the fiber manufacturing process for making composite PTFE hollow tubes for ozonizing applications. The first step of this process involves extruding PTFE paste derived from a mixture of PTFE powder and lubricants. After the tube is formed, the lubricants are extracted and the powder sintered into a slightly porous PTFE solid tube. The tube is then stretched longitudinally to make it porous. This is different than typical PTFE flat sheet membranes made by a similar process. To generate really fine microporous structures, characterized by a node to fibrils network, most PTFE membranes are made by biaxial stretching. For hollow fibers, the equivalent process would have been stretching the fiber radially. Probably because of the impracticality of such a step, this radial stretching step is missing from the disclosed process. Consequently, the pores in this tube are only "half-formed", i.e. it did not attain the "node to fibril network" of flat sheet membrane. To compensate for this deficiency, the tube underwent a second step of laminating a regular microporous flat sheet membrane on top of the external surface of the porous tube. This step involves lamination of a long narrow strip of PTFE microporous membrane spirally on the surface of the tubing. This is a tedious, labor intensive process. Also, with the membrane laminated to the outside of the hollow tube, the resistance to mass transfer in tube-side flow could be higher in cases where the fluid partially intrudes into the support layer. This arrangement diminishes the potential of using the membrane as the barrier for separating the two fluid phases. These deficiencies are overcome with the hollow fiber membranes of the present invention.

An advantage for contacting applications is that the very low surface tension of these perfluorinated polymers allows use with low surface tension liquids. For example, highly corrosive developers used in the semiconductor manufacturing industry may contain surface tension reducing additives, such as surfactants. These developers could not be degassed with typical microporous membranes because the liquid would intrude the pores at the pressures used and permeate, causing solution loss and excess evaporation. In addition, liquid filling the pores would greatly add to the mass transfer resistance of gas transport. U.S. Pat. No. 5,749,941 describes how conventional hollow fiber membranes of polypropylene or polyethylene cannot be used in carbon dioxide or hydrogen sulfide absorption into aqueous solutions containing an organic solvent without the use of a solution additive to prevent leakage. While polytetrafluoroethylene (PTFE) membranes would work in these applications, presumably because of their lower surface tension, they are difficult to process into hollow fibers. The membranes of the present invention are made from polymers having similar surface tension properties to PTFE and are more readily manufactured into small diameter hollow fiber membranes.

WO 9853894 describes a process of forming compact, high flux, fouling resistant gas filters by coating continuous ultra thin layer of non-porous gas permeable polymer over filter surface by contacting one side of microporous substrate with dilute coating solution of polymer, preferably amorphous copolymer of perfluoro-2,2-dimethyl-1,3-dioxole, which is hydrophobic and oleophobic. Substrate pore size filters polymer from solution as solvent flows through, leaving ultra thin layer of polymer. Process is useful to coat sheet and hollow fiber substrates, particularly multiple hollow fibers assembled in modules. These membranes have been described as useful for contactor applications. (S. Nemser, Paper presented at 1998 North American Membrane Society Meeting.) This method requires a separate and complex coating step to produce a non-porous contactor fiber. Furthermore, a fully perfluorinated thermoplastic contactor is not described.

BRIEF SUMMARY OF THE INVENTION

In a first embodiment of the present invention, a highly asymmetric perfluorinated thermoplastic hollow fiber is used as the barrier. The membrane is comprised of a skinned surface on one diameter, and a porous surface on the other diameter. The smaller pored skinned surface of the asymmetric membrane is designed to face the liquid flow and offer the highest resistance to liquid intrusion. The thin skin offers low diffusional resistance, yet the small pores offer the highest intrusion resistance. Also, the perfluorinated surface has low interfacial energy, which further increases the resistance to liquid intrusion.

In a second embodiment, a perfluorinated thermoplastic microporous hollow fiber membrane is used as the barrier. These membranes are useful in applications where the membrane resistance to mass transfer may be controlling, or liquid intrusion into the pores is a lesser problem.

In a third embodiment, the skinned surface of the perfluorinated thermoplastic hollow fiber membrane is non-porous.

This invention provides for a fully perfluorinated thermoplastic hollow fiber membrane contactor with unitary end structures having a high packing density and capable of operating with liquids having interfacial surface tension of greater than about 20 mN/m at 20° C. A manufacturing method for the contactor is provided and described.

The contactor is comprised of a bundle of substantially parallel hollow fiber membranes potted at both ends and having unitary end structure(s) with the housing containing the fibers. The perfluorinated thermoplastic hollow fiber membranes of this invention are made of polymers such as poly (tetrafluoroethylene-co-perfluoro (alkylvinylether)), poly (tetrafluoroethylene-co-hexafluoropropylene), or blends thereof. The contactor 2 has fluid inlets and outlet connections for the two fluids to be contacted. As illustrated in FIG. 1, fluid 1 enters the contactor 2 through the fiber lumens 3, traverses the interior of the contactor 2 while in the lumens 3, where it is separated from fluid 1 by the membrane, and exits the contactor 2 through the fiber lumens at connection 20. Fluid 4 enters the housing through connection 30 and substantially fills the space between the inner wall of the housing and the outer diameters of the fibers, and exits through connector 20.

In the first embodiment, the fibers are asymmetric skinned membranes having a porous skinned surface on one diameter and a porous surface on the other diameter, with the fiber wall between comprising a porous structure. The process of making a contactor of the first embodiment from asymmetric skinned perfluorinated thermoplastic polymers uses hollow fiber membranes made by the process described in concurrent U.S. patent application No. 60/117,854, filed Jan. 29, 1999, the disclosure of which is incorporated by reference. For use with liquid on the lumen of the fibers, the inner diameter will be made skinned, and for use with liquid on the outer or shell side of the fibers, the outer diameter of the fibers will be made skinned. The potted fibers are spaced closely, without any fiber crossover or fibers impinging on each other so tightly that they can not be forced apart by the liquid or gas flow. For liquid flow in the lumen, which is the preferred mode of operation for liquid-gas contacting, the fibers do not have to be spaced uniformly apart. This simplifies the contactor manufacturing process.

In the second embodiment, perfluorinated thermoplastic microporous hollow fiber membranes are made by a process disclosed in patent application No. 60/117,852 filed Jan. 29, 1999, the disclosure of which is incorporated by reference. Equivalent membranes made by another process could also be used. Preferred polymers are perfluorinated thermoplastic polymers, more specifically poly (tetrafluoroethylene-co-perfluoro (alkylvinylether)) (poly (PTFE-CO-PFVAE)), poly (tetrafluoroethylene-co-hexafluoropropylene) (FEP), or blends of these polymers, which are dissolved in a solvent to give a solution having an upper critical solution temperature, and which when the solution is cooled, separates into two phases by liquid-liquid phase separation. Teflon® PFA is an example of a poly (tetrafluoroethylene-co-perfluoro (alkylvinylether)) in which the alkyl is primarily or completely the propyl group. FEP Teflon® is an example of poly (tetrafluoroethylene-co-hexafluoropropylene). Both are manufactured by DuPont, Wilmington, Del. Neoflon™ PFA (Daikin Industries) is a polymer similar to DuPont's PFA Teflon®. A poly (tetrafluoroethylene-co-perfluoro (alkylvinylether))polymer in which the alkyl group is primarily methyl is described in U.S. Pat. No. 5,463,006. A preferred polymer is Hyflon® POLY (PTFE-CO-PFVAE) 620, obtainable from Ausimont USA, Inc., Thorofare, N.J.

In a third embodiment, the conditions of membrane making of the first embodiment are adjusted to produce a skinned asymmetric membrane with a non-porous skin. A preferred method is to increase the amount of polymer used in the solution used to make the membranes.

The fibers are made by a Thermally Induced Phase Separation (TIPS) method, in which polymer is dissolved in a solvent at high temperatures and extruded through an annular die into a cooling bath. The resulting gel fiber is wound as a continuous coil on a steel frame with the fibers substantially parallel and not touching. The frame and coil are placed in an extraction bath to remove the solvent from the gel fiber. After extraction, the fibers are annealed on the frame for about 24 hours and then cooled. The fibers are removed from the frame and the flat coil of fibers is re-annealed to relax the fibers and prevent shrinkage in the potting and bonding step. The fibers are removed from the annealing oven and cooled. They are then gathered into a cylindrical bundle and potted and bonded in a single step.

Potting is a process of forming a tube sheet having liquid tight seals around each fiber. The tube sheet or pot separates the interior of the final contactor from the environment. The pot is thermally bonded to the housing vessel in the present invention to produce a unitary end structure. The unitary end structure comprises the portion of the fiber bundle which is encompassed in a potted end, the pot and the end portion of the perfluorinated thermoplastic housing, the inner surface of which is congruent with the pot and bonded to it. By forming a unitary structure, a more robust contactor is produced, less likely to leak or otherwise fail at the interface of the pot and the housing. The potting and bonding process is an adaptation of the method described in U.S. patent application No. 60/ 117,853 filed Jan. 29, 1999, the disclosure of which is incorporated by reference.

Potting and bonding are done in a single step. An external heating block is used for potting one end at a time. The perfluorinated thermoplastic end seals are preferably made of poly (tetrafluoroethylene-co-perfluoro (alkylvinylether)) having a melting point of from about 250° C. to about 260° C. A preferred potting material is Hyflon® 940 AX resin, from Ausimont USA Inc. Thorofare, N.J. Low viscosity poly (tetrafluoroethylene-co-hexafluoropropylene) with low end-of-melt temperatures as described in U.S. Pat. No. 5,266,639 is also suitable. The process involves heating the potting material in a heating cup at around 275° C. until the melt turns clear and are free of trapped bubbles. A recess is made in the molten pool of potting material that remains as a recess for a time sufficient to position and fix the fiber bundle and housing in place. Subsequently, the recess will fill with the molten thermoplastic in a gravity driven flow.

A unitary end structure, by which is meant that the fibers and the pot are bonded to the housing to form a single entity consisting solely of perfluorinated thermoplastic materials is prepared by first pretreating the surfaces of both ends of the housing before the potting and bonding step. This is accomplished by melt-bonding the potting material to the housing. The internal surfaces on both ends of the housing are heated close to its melting point or just at the melting point and immediately immersed into a cup containing powdered (poly (PTFE-CO-PFVAE)) potting resin. Since the surface temperature of the housing is higher than the melting point of the potting resins, the potting resin is then fused to the housing resin—a condition for bonding to occur. The housing is then taken out and polished with a heat gun to fuse any excess unmelted powder. Without this pretreatment step, the housing surfaces often detach from the potting surfaces because of absence of intermixing of the two resins.

The unitary end structure(s) is cut and the lumen of the fibers exposed. The potted surfaces are then polished further using a heat gun to melt away any smeared or rough potted surfaces. A solder gun can be used to locally remelt and repair any defective spot, sometimes with the help of a drop of melted resin.

DETAILED DESCRIPTION OF THE INVENTION

Figure 1:
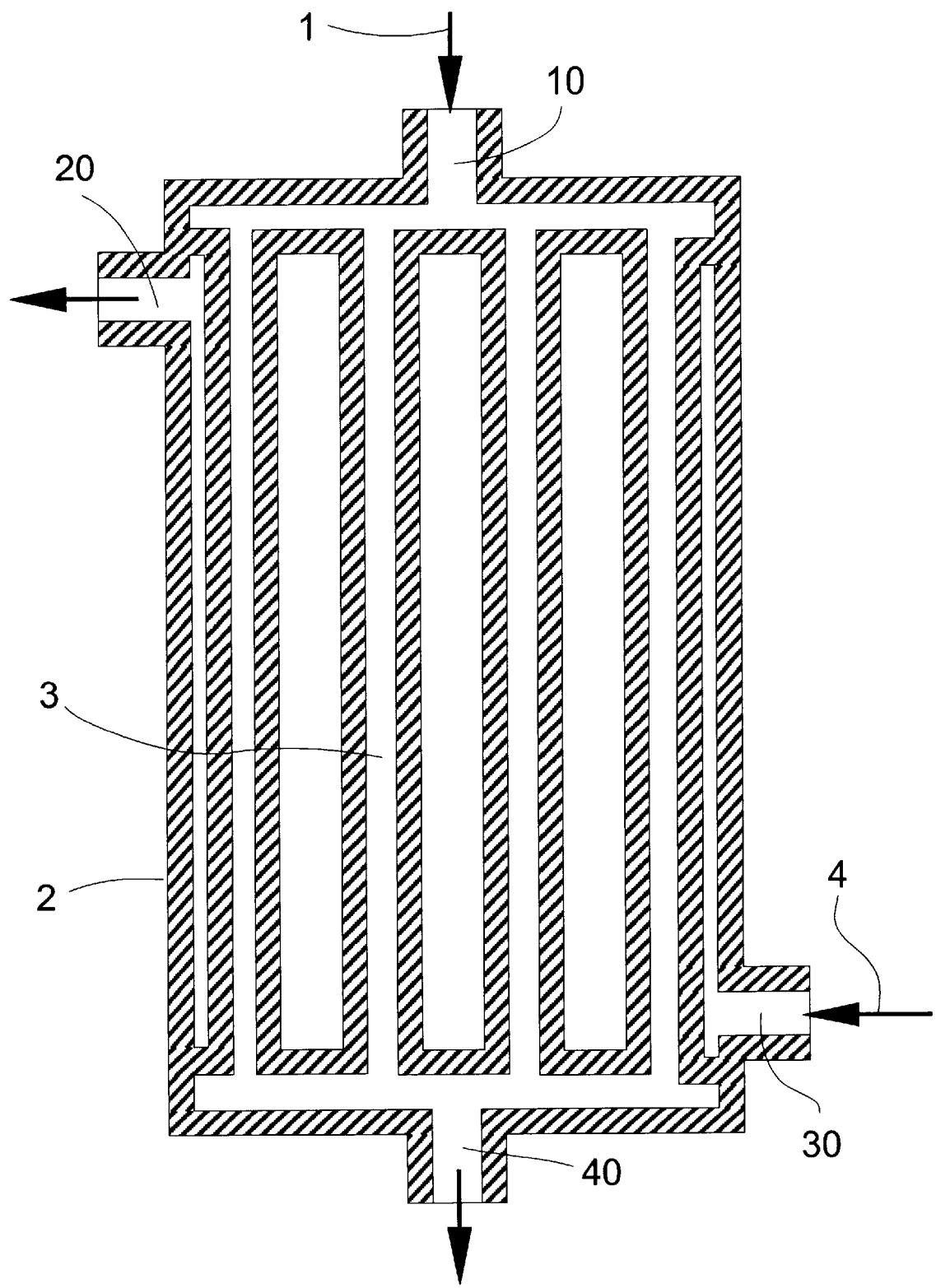
FIG. 1 is an illustration of a hollow fiber membrane contactor.

The asymmetric skinned hollow fiber membrane is produced by the process described in concurrent U.S. patent application No. 60/117,854 filed Jan. 29, 1999, the disclosure of which is incorporated by reference. That process is based on the Thermally Induced Phase Separation (TIPS) method of making porous structures and membranes. A mixture of perfluorinated thermoplastic polymer pellets, usually ground to a size smaller than supplied by the manufacturer, from about 100 to about 1000 microns, preferably about 300 microns, more preferably supplied or ground to a powder, and solvent, such as chlorotrifluoroethylene oligimer, is first mixed to a paste or paste-like consistency. The polymer comprises between approximately 12% to 75%, preferably 30% to 60%, by weight of the mixture. Preferred polymers are perfluorinated thermoplastic polymers, more specifically poly (tetrafluoroethylene-co-perfluoro (alkylvinylether)) (poly (PTFE-CO-PFVAE)) or poly (tetrafluoroethylene-co-hexafluoropropylene) (FEP), or blends of these polymers, which are dissolved in a solvent to give a solution having an upper critical solution temperature, and which when the solution is cooled, separates into two phases by liquid-liquid phase separation. PFA Teflon® is an example of a poly (tetrafluoroethylene-co-perfluoro (alkylvinylether)) in which the alkyl is primarily or completely the propyl group. FEP Teflon® is an example of poly (tetrafluoroethylene-co-hexafluoropropylene). Both are manufactured by DuPont. Neoflon™ PFA (Daikin Industries) is a polymer similar to DuPont's PFA Teflon®. A poly (tetrafluoroethylene-co-perfluoro (alkylvinylether)) polymer in which the alkyl group is primarily methyl is described in U.S. Pat. No. 5,463,006. A preferred polymer is Hyflon® POLY (PTFE-CO-PFVAE) 620, obtainable from Ausimont USA, Inc., Thorofare, N.J., The solvent is chosen so the membrane formation occurs by liquid-liquid, rather than solid-liquid phase separation when the solution is extruded and cooled. Preferred solvents are saturated low molecular weight polymers of chlorotrifluoroethylene. A preferred solvent is HaloVac® 60 from Halocarbon Products Corporation, River Edge, N.J. Choice of the solvent is dictated by the ability of the solvent to dissolve the polymer when heated to form an upper critical solution temperature solution, but not to excessively boil at that temperature. Fiber extrusion is referred to as spinning and the extruded fiber length from the die exit to the take-up station is referred to as the spin line. The paste is metered into a heated extruder barrel where the temperature raised to above the upper critical solution temperature so that dissolution occurs. For inside skinned hollow fiber membranes, the homogeneous solution is then extruded through an annular die directly into a liquid cooling bath with no air gap. The lumen diameter is maintained with a constant pressure of gas. The liquid cooling bath is maintained at a temperature below the upper critical solution temperature of the polymer solution. The preferred bath liquid is not a solvent for the thermoplastic polymer, even at the extrusion temperature. Upon cooling, the heated and shaped solution undergoes phase separation and a gel fiber results. The die tip is slightly submerged for vertical spinning, i.e.; the spin line falls downward, in the direction of a freely falling body. For horizontal spinning, where the spin line exits directly in the horizontal attitude, and is maintained more or less in that plane until at least the first guide roll, a specially designed die is used. The die is firmly positioned against an insulated wall with the die tip penetrating through an opening having a liquid-tight seal in the insulator wall. A trough for cooling liquid flow is placed in a recess in the opposite side of the insulating wall, in a manner that will maintain the die nose outlet in a submerged condition. Cooling liquid flows in the trough and overflows in a region of the trough of lesser depth, keeping the die nose outlet submerged with a flow of cooling liquid. In both the vertical and horizontal methods, a booster heater and temperature control means is used to briefly raise the solution temperature at the die tip to prevent premature cooling. In a subsequent step, the dissolution solvent is removed by extraction and the resultant hollow fiber membrane is dried under restraint to prevent membrane shrinkage and collapse. Optionally, the dried fiber may be heat set at 200° C. to 300° C. Preferably the fiber will be heat set or annealed under restraint at a temperature near the melting temperature of the fiber, which for the preferred polymer of this invention is within a range of from about 270° C. to about 290° C., preferably from about 275° C to about 285° C., with the most preferred range from about 278° C. to about 282° C. In order to minimize shrinkage during potting, a second, unrestrained, annealing step at similar temperatures is a preferred step. Annealing times for these step is from about 6 to about 48 hours, more preferably, from about 18 to about 30 hours.

In the invention described in U.S. Ser. No. 60/117,854, controlled evaporation of solvent from at least one surface of the hollow fiber as it exits the die tip is combined with higher polymer solids solutions and the submerged extrusion process to produce inner diameter skinned asymmetric hollow fiber porous membranes from perfluorinated thermoplastic polymers. For this embodiment, the lumen is maintained with a constant pressure of a gas continuously fed into the inner diameter of the lumen. In this embodiment the superheated solvent evaporates inside the lumen as soon as it emerges from the die. The loss of solvent causes a superficial increase in solids concentration on the inner lumen surface. As the melt is quenched, a very thin skin is formed on the lumen surface, while the rest of the membrane forms a microporous structure due to its being submerged in a cooling or quenching bath which prevents the porogen from flashing off the outer surface and prevents the formation of a skin on the outer surface.

To produce an asymmetric skinned perfluorinated thermoplastic hollow fiber membrane with the skin on the outer surface, the process described above is adapted so the lumen is filled with a liquid to prevent evaporation at the inner surface and the outer surface is exposed to the atmosphere in a very short air gap before entering the cooling bath. The lumen-filling liquid can be a liquid that does not boil or excessively vaporize during the extrusion process. Preferred liquids are mineral oil, silicone oil, and dioctylpthlate, with a most preferred liquid being a low molecular weight saturated chlorotrifluorohydrocarbon polymer.

To produce perfluorinated thermoplastic microporous hollow fiber membrane, the teachings of U.S. patent application serial No. 60/117,852, filed Jan. 29, 1999, are used. This application provides for high flux, skin-free hollow fiber porous membranes, more specifically, microporous membranes, from perfluorinated thermoplastic polymers, more specifically poly (tetrafluoroethylene-co-perfluoro (alkylvinylether)) (poly (PTFE-CO-PFVAE)) or poly (tetrafluoroethylene-co-hexafluoropropylene) (FEP) or blends of these polymers.

A process to produce these membranes is provided. The process is based on the Thermally Induced Phase Separation (TIPS) method of making porous structures and membranes. A mixture of polymer pellets, usually ground to a size smaller than supplied by the manufacturer, from about 100 to about 1000 microns, preferably about 300 microns, more preferably supplied or ground a to a powder and a solvent, such as chlorotrifluoroethylene oligimer, is first mixed to a paste or paste-like consistency. The polymer comprises between approximately 12% to 35% by weight of the mixture. The solvent is chosen so the membrane formation occurs by liquid-liquid, rather than solid-liquid phase separation when the solution is extruded and cooled. Preferred solvents are saturated low molecular weight polymers of chlorotrifluoroethylene. A preferred solvent is HaloVac® 60 from Halocarbon Products Corporation, River edge, N.J. Choice of the solvent is dictated by the ability of the solvent to dissolve the polymer when heated to form an upper critical solution temperature solution, but not to excessively boil at that temperature. Fiber extrusion is referred to as spinning and the extruded fiber length from the die exit to the take-up station is referred to as the spin line. The paste is metered into a heated extruder barrel where the temperature raised to above the upper critical solution temperature so that dissolution occurs. The homogeneous solution is then extruded through an annular die directly into a liquid cooling bath with no air gap. The liquid cooling bath is maintained at a temperature below the upper critical solution temperature of the polymer solution. The preferred bath liquid is not a solvent for the thermoplastic polymer, even at the extrusion temperature. Upon cooling, the heated and shaped solution undergoes phase separation and a gel fiber results. The die tip is slightly submerged for vertical spinning, i.e.; the spin line falls downward, in the direction of a freely falling body. For horizontal spinning, where the spin line exits directly in the horizontal attitude, and is maintained more or less in that plane until at least the first guide roll, a specially designed die is used. The die is firmly positioned against an insulated wall with the die tip penetrating through an opening having a liquid-tight seal in the insulator wall. A trough for cooling liquid flow is placed in a recess in the opposite side of the insulating wall, in a manner that will maintain the die nose outlet in a submerged condition. Cooling liquid flows in the trough and overflows in a region of the trough of lesser depth, keeping the die nose outlet submerged with a flow of cooling liquid. In both the vertical and horizontal methods, a booster heater and temperature control means is used to briefly raise the solution temperature at the die tip to prevent premature cooling. In a subsequent step, the dissolution solvent is removed by extraction and the resultant hollow fiber membrane is dried under restraint to prevent membrane shrinkage and collapse. Optionally the dried fiber may be heat set at 200° C. to 300° C.

The potting method is described in concurrent U.S. patent application No. 60/117,853, filed Jan. 29, 1999, incorporated by reference. This application describes a simplified method for manufacturing a filter element of perfluorinated thermoplastic hollow fiber membranes potted with a perfluorinated thermoplastic polymer. The method comprises vertically placing a portion of a bundle of hollow fiber membrane lengths with at least one closed, by the closed end, into a temporary recess made in a pool of molten thermoplastic polymer held in a container, holding the fiber lengths in a defined vertical position, maintaining the thermoplastic polymer in a molten state so that it flows into the temporary recess, around the fibers and vertically up the fibers, completely filling the interstitial spaces between fibers with the thermoplastic polymer. A temporary recess is a recess that remains as a recess in the molten potting material for a time sufficient to position and fix the fiber bundle in place and then will be filled by the molten thermoplastic. The temporary nature of the recess can be controlled by the temperature at which the potting material is held, the temperature at which the potting material is held during fiber bundle placement, and the physical properties of the potting material. A temporary recess can also be a recess in a solid thermoplastic which will fill when the thermoplastic is heated to a temperature sufficiently above its softening or melting temperature to flow, and held at that temperature for the time necessary to fill the recess. The end of the fiber can be closed by sealing, plugging, or in a preferred embodiment, by being formed in a loop.

Figure 2A:
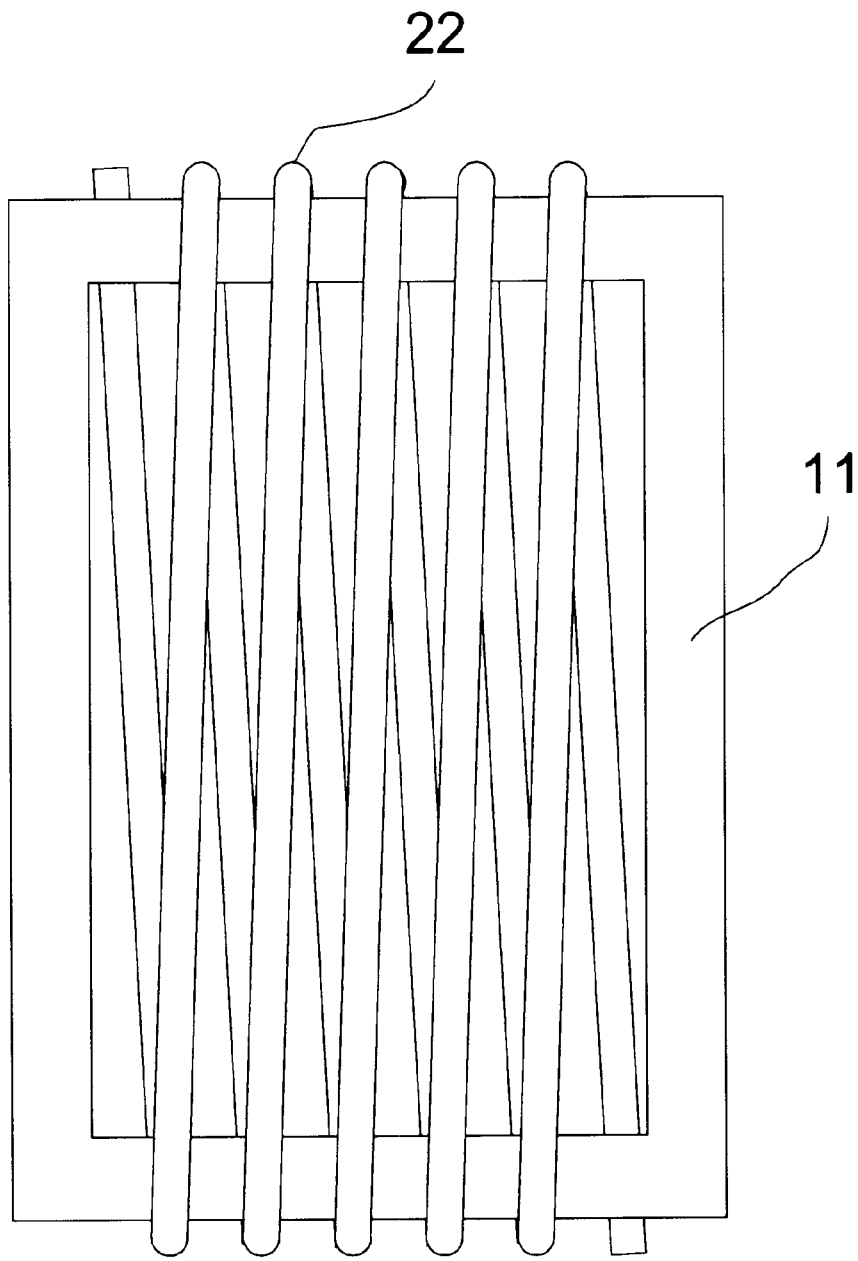
FIG. 2a is an illustration of hollow fiber membrane wrapped around a frame.
Figure 2B:
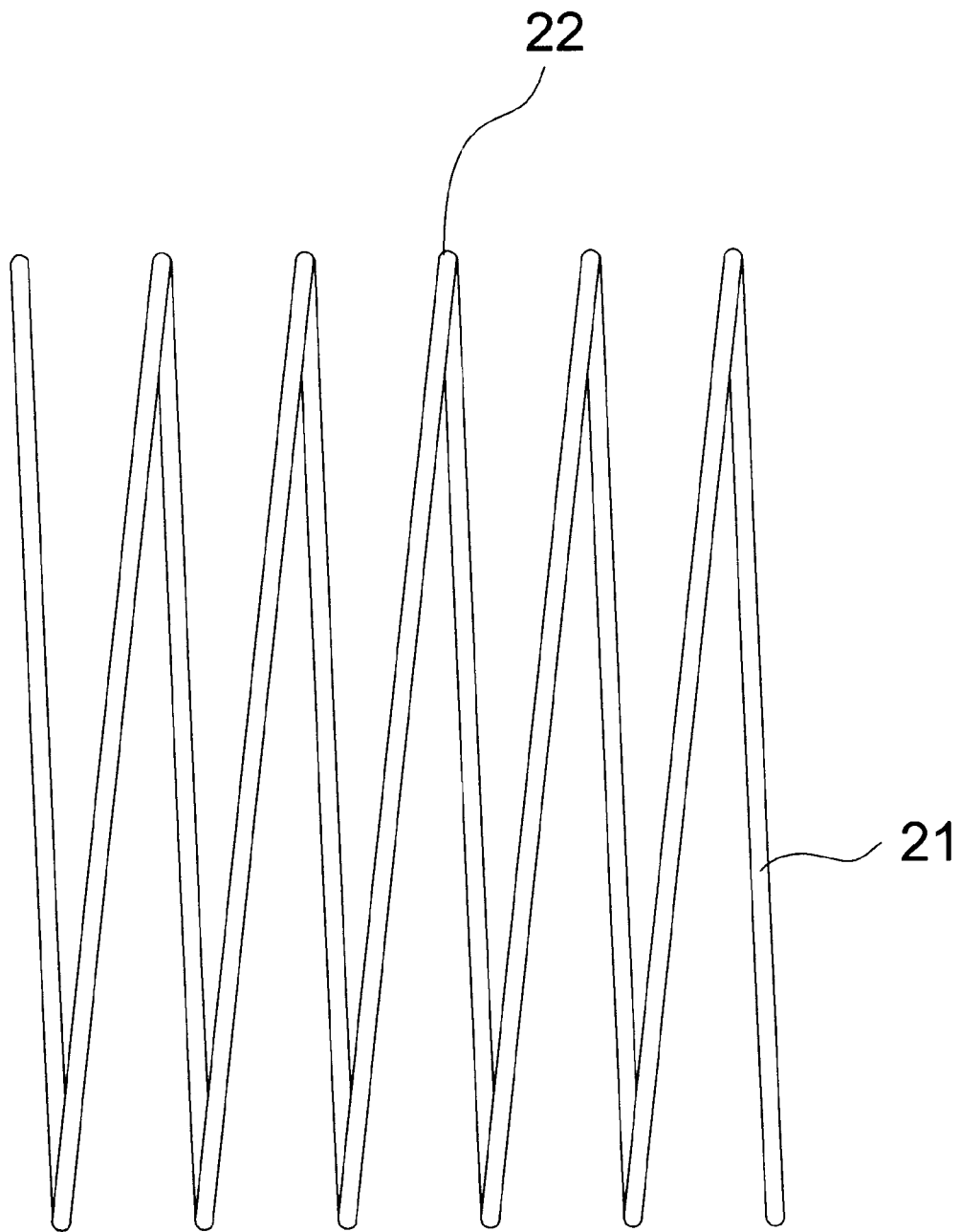
FIG. 2b is an illustration showing a flat rectangular coil of hollow fiber membrane.
Figure 3:
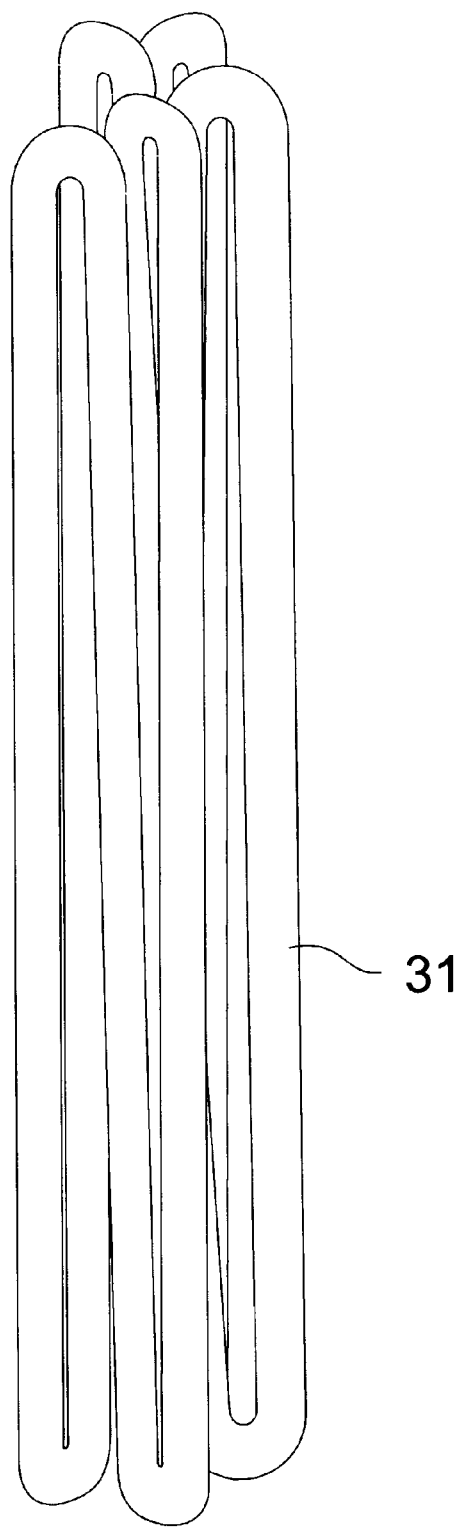
FIG. 3 is an illustration of a flat rectangular coil formed into a cylindrical fiber bundle.

In the present invention, the fibers are wound around a metal frame and heat set into the form of a flat rectangular coil, as illustrated in FIG. 2a, which shows the fiber 10 wrapped around a frame 11 and FIG. 2b, which shows the flat rectangular coil after annealing and removal from the frame. The ends of the coil 11, form loops 12, shown in FIG. 2b that are closed to entry by the molten potting material. The flat rectangular coil is formed into a substantially cylindrical shape 31 as illustrated in FIG. 3 and positioned in a perfluorinated thermoplastic housing 2 in FIG. 1. The fibers are temporarily held in position in the housing 2 during potting by holding means. Examples of such means are given in application No. 60/117,853. The fiber cylinder can be formed by, for example, winding on a core or without a core. The inner wall of the housing 2 defines the flow space for the fluid to be contacted on the outer diameter of the fibers, the shell side. In the present invention, the housing 2 should be of a perfluorinated thermoplastic polymer grade that has a melting temperature at least about 15° C.–20° C. higher than the potting material. The housing 2 is pretreated with the lower melting potting material by heating the housing 2 to a temperature higher than the melting temperature of the potting material, but below the melting temperature of the housing 2 material. The heated housing is immersed into a container of potting material in a powdered form. The higher temperature of the housing 2 causes the potting material to fuse to the housing 2 so that a strong bond can be formed in the subsequent potting and bonding step. It is crucial for the housing material to have a melting or softening temperature in order to soften when heated near to the melting or softening point of the housing material. Without limiting the invention, it is believed that in order to produce a unitary end structure, there has to be a certain amount of intermixing of the housing and the potting polymers, which can only occur if both are at, above or very near their respective melting or softening points. The portion of the pretreated housing and fibers desired to be in the potted region is placed in the temporary recess without contacting the molten potting material within. The potting material will, over the course of time, flow up and around the fibers, and up and around the housing. Bonding to the pretreated a housing will form a unitary end structure having improved durability because the pretreatment eliminates the interface between dissimilar materials. If the housing were of the same melting temperature as the potting compound, it would soften excessively and deform during potting. After potting material flow has ceased, the molten pool is cooled and the potted end is removed from the heating container. A second potting step as described is then done on the second end. Excess thermoplastic polymer potting material is removed and the ends in the pot are opened by cutting through the potting material perpendicularly or at an angle less than 90° to the long axis.

Optionally, a mat of fibers can be made by arranging individual fiber lengths in a row perpendicular to the fiber length, the fiber lengths substantially equal distances apart, and joining the adjacent fiber ends at each end of the fibers with a continuous means, such as a tape. The continuous means can also seal the ends or one or both ends can be sealed separately. The mat can then be rolled on an axis parallel to the fiber lengths, either on a core or without a core. The rolled-up mat is then placed in the hollow body as described above. In either of these optional methods, the potting then proceeds as described above.

In a preferred embodiment, the first step of making a (poly (PTFE-CO-PFVAE)) hollow fiber contactor is to wind gel (poly (PTFE-CO-PFVAE)) hollow fibers onto a steel frame to form continuous loops on both sides of the frame. Gel fibers are raw, unextracted fibers with porogen (Halocarbon oil) still embedded in the membrane structure. The gel fibers should be substantially parallel to each other. They are spaced closely, yet do not touch or cross each other's paths. The framed fibers are then put into a degreaser to extract the porogens from the membrane. After 24 hrs of extraction, the extracted fiber wound frames are put into an oven to anneal the fiber for 24 hrs at a temperature in the range of from about 270° C. to about 290° C., preferably from about 275° C. to about 285° C., with the most preferred range from about 278° C. to about 282° C. Since the polymer has a broad melting temperature range, it is sometimes possible to anneal at a temperature slightly higher than the peak or average melting temperature. The fiber frames are retrieved and cooled. After cooling, the fibers are removed from the frame. The looped fiber bundle or bundles are then put back into the oven to anneal for another 24 hrs at the same temperature. The first step anneals the fiber at high temperature under tension, where most of the mechanical properties are set. The second annealing step relaxes the fiber, allowing the fiber to shrink to the equilibrium length with no tension at the annealing temperature. Although the shrinkage is very small, about 5%, this second relaxation step is critical as it prevents shrinkage of the hollow fibers during potting, which would have resulted in non-integral modules.

In the method of the present invention, bonding and potting are combined into a single step. The housing is usually (poly (PTFE-CO-PFVAE) tubing. It is important to have a polymer grade with a melting temperature approximately 15–25° C. higher than the potting (poly (PTFE-CO-PFVAE)) resin, which melts around 256° C. The perfluorinated thermoplastic pots are preferably made of poly (tetrafluoroethylene-co-perfluoro (alkylvinylether)) having a melting point of from about 250° C. to about 260° C. A preferred potting material is Hyflon® 940 AX resin, from Ausimont USA Inc. Thorofare, N.J. Low viscosity poly (tetrafluoroethylene-co-hexafluoropropylene) with low end-of-melt temperatures as described in U.S. Pat. No. 5,266,639 are also suitable. Teflon® PFA melts at significantly higher temperature, about 310° C., therefore, is a suitable housing material. However, Teflon® FEP has too low a melting point (250° C.) while PTFE, not being a thermoplastic does not melt. Therefore, both of these polymers cannot be used as housing material by the preferred method. FEP could be used with lower melting potting materials if such were useful or desired. PTFE may be used, if, for example, the inner surface were to be roughened or abraded sufficiently to obtain a satisfactory bond with the melted potting material. The internal surfaces of both ends of the housing must be pretreated for the bonding process to occur. The internal surfaces on both ends of the housing are heated to or close to its melting point. At this condition, visually the housing turns from opaque to a crystal clear wall. Once optical clarity is achieved, the heated end is immediately immersed into a cup containing powdered (POLY (PTFE-CO-PFVAE)) potting resin. Since the surface temperature of the housing is higher than the melting point of the potting resins, the potting resin is then fused to the housing resin—a condition for bonding to occur. The housing is then taken out and polished with a heat gun to fuse any excess unmelted powder. Without this pretreatment step, the housing surfaces often detach from the potting surfaces because of absence of intermixing of the two resins.

One end is potted and made into a unitary end structure at a time. The process involves heating the potting resins in a heating cup with an external heating block or other heat source at a temperature in the range of from about 265° C. to around 285° C., with a preferred range of from about 270° C. to around 280° C., until the melt turns clear and are free of trapped bubbles. A rod is inserted into the melt to create a cavity. The housing and the fiber bundle are then inserted into the cavity. It is important to note that at this point neither the fiber bundle nor the housing touches the potting resin. The melted resin will flow by gravity to fill the voids over time to pot the fiber and bond to the housing simultaneously. Typically, this process takes 2 days for each end of the bundle.

After the potted ends are cooled, they are then cut and the lumen of the fibers exposed. The potted surfaces are then polished further using a heat gun to melt away any smeared or rough potted surfaces. For module with a large number of fibers, such as 2000 or more, it is quite common that the module may have one or two fiber or potting defects. Potting defects are easy to spot, they appear as white spots among a mostly translucent potting surface. Fiber defects must be isolated by bubble point test. However, the repair of the module is rather straightforward. A solder gun is used to remelt the defective spot, sometimes with the help of a drop of melted resin. Properly potted modules have very few defects, normally one or two spots. Improperly potted modules have gapping holes, sometimes with sections of the fibers unpotted. An alternative potting method may be used. This method is described in U.S. patent application No. 60/117,856, filed Jan. 29, 1999, incorporated in its entirety by reference.

In this method, an array of hollow fiber membranes may be fabricated by either winding the length of the array upon itself or upon a mandrel. The mandrel, if chosen, is preferably circular in cross section, however other cross sections, such as oval, square, rectangular or polygonal may also be used.

The wound hollow fiber membrane is arranged in a single layer, with the windings being substantially parallel to one another either in contiguous contact with, or spaced uniformly apart from, one another. When the appropriate length of hollow fiber membrane is accumulated on the mandrel, one or more strips of tape means are applied to the outer surface of the hollow fiber membrane segments and positioned along the length of the mandrel in an orientation parallel to its axis of rotation and perpendicular to the central axis of the individual hollow fiber segments. The tape extends from the first hollow fiber membrane segment wound on the mandrel to the last and preferably extends about 1 cm beyond each end of the fiber array. The hollow fiber membrane segments are slit along the middle of the entire length of the tape means such that the hollow fiber membranes remain joined together by the now halved strip of tape.

A single screw extruder feeding a thermoplastic sealing polymer to a dual slot extrusion die produces two polymer ribbon-like extrusions. A suitable length of a perfluorinated thermoplastic tube is mounted on a removable winding mandrel positioned below the extrusion die, with the rotational axis of the mandrel being parallel to a line connecting the two outlets of the extrusion die. Before the winding of the array and the formation of the tubesheets, the tube must be pre-heated. This step is necessary to obtain a good bond between the tubesheet and the tube. The heated perfluorinated thermoplastic tube is rotated and extrusion of the twin ribbons is initiated.

Following the accumulation of approximately a one-half turn of the polymer ribbon extrusions on the tube, the leading edge of the hollow fiber membrane array is positioned under and parallel to the tube with the adhesive side of the extended strip of tape means facing the tube. The tape is then brought into contact with the tube outboard of the tubesheets and wound up on the tube. A slight tension is maintained on the hollow fiber array to keep the fibers in contact with the polymer extrusions. Application of the polymer extrusions may be terminated after the entire array is wound about the mandrel. Alternatively, the tubesheets may be built up to a larger diameter depending on the requirements of the rest of the module assembly process. In this case, the rotation of the winding mandrel continues as the molten tubesheets are allowed to cool. The end portions of the sealed fiber bundle can be trimmed to expose the fiber lumens and further machining may be performed to provide a means for sealing the fiber bundle into a suitable housing or the fiber bundle may be contoured to provide details suitable for thermoplastically bonding it to the components of a pressure housing of the same or similar resin material in order to produce a hollow fiber module.

In an alternative configuration, a single common pot may be used for both separate ends. This configuration would be useful, for example, where it is desirable to have the inlet and outlet in close proximity for convenience and to reduce space. To be potted in a common pot, the fiber bundle would be formed into a U-shape or other practical geometric form to bring the separate bundle ends close together. A single potting would be done in the manner described above, with the necessary adaptations needed to accommodate the dimensions encompassed by the two fiber bundle ends. The housing may also be U-shaped, with each end terminating in the common pot, although a large enough straight housing could also be used. The single unitary end structure with the two potted fiber bundle ends would then be machined, or would have been molded so as to be able to accommodate separate flow connections. Separate flow connections would then be made to each bundle end, so that the inlet flow could enter one of the fiber bundle ends, and exit the other without intermixing.

Characterization Methods

Flow Rate Test

Two strands of fiber in the form of loops are fit into a ¼" polypropylene tubing about 1" long. A hot melt gun is used to force hot melt glue through the open end of the tubing to pot the fibers. Normally, the glue does not fill up all the spaces between the fibers. To complete the potting, hot melt glue is applied to the other end of the tube. The length of the fibers, from the end of the potting to the loop, should be about 3.5 centimeters. After the hot melt glue solidifies, the tubing is cut to expose the fiber lumens. The fiber OD is measured under a microscope. The tubing with the fiber loop is mounted into a test holder. Isopropyl alcohol (IPA) is poured into the holder, the holder sealed, and gas pressure is set to 13.5 psi. The time interval to collect a set amount of IPA permeate is recorded.

Sample Calculations $$\text{IPA Flow RATE} = V/(T*\pi*OD*N*L)$$

IPA FlowTime (FT)=seconds to collect 500 ml IPA permeate; calculated from the time measured to collect a convenient volume from the set-up described.

where;

V=volume of permeate

T=time

OD=outside diameter of fiber

N=number of fibers

L=total length of one strand of exposed fiber

Intrusion Pressure Test

Several strands of fiber in the form of loops are fit into a ¼" polypropylene tubing about 1" long. A hot melt gun is used to force hot melt glue through the open end of the tubing to pot the fibers. Normally, the glue does not fill up all the spaces between the fibers. To complete the potting, hot melt glue is applied to the other end of the tube. The length of the fibers, from the end of the potting to the loop, is about 3 inches. After the hot melt glue solidifies, the tubing is cut to expose the fiber lumens. The fiber OD is measured under a microscope. The tubing with the fiber loop is mounted into a test holder and connected to a container holding the test fluid and attached to a pressure generating system, such as a pressurized gas tank. The pressure in the container is raised at increments, for example, 10 psi steps, and the test fluid forced into the lumens of the fibers. Any intrusion of the test fluid is readily observed as a darkening of the fibers from the test fluid filling the pores of the fibers. The pressure of each step is maintained for about 20 minutes, or unless intrusion is observed. If no intrusion is observed, pressure is raised to the next increment and the test continued.

Visual Bubble Point

Two strands of fiber are loops to fit into a ¼" polypropylene tubing about 1" long. A hot melt gun is used to force hot melt glue through the open end of the tubing to pot the fibers. Normally, the glue does not fill up all the spaces between the fibers. To complete the potting, hot melt glue is applied to the other end of the tube. The length of the fibers, from the end of the potting to the loop, should be about 3.5 centimeters. After the hot melt glue solidifies, the tubing is cut to expose the fiber lumens. The fiber OD is measured under a microscope. The tubing with the fiber loop is mounted into a test holder. The potted fiber loop is mounted in a bubble point test holder. The loop is submerged in a glass container of IPA. Air pressure is slowly increased in the lumen of the fibers. The pressure at which the first bubble appears at the outer surface of the fibers is registered as the visual bubble point.

Scanning Electron Microscopy Images

Samples of hollow fiber membrane are soaked in isopropyl alcohol or a mixture of isopropyl alcohol and water, approximately 50% by volume. The wetted sample is then soaked in water to replace the alcohol. The water-wetted sample is held by a tweezers and dipped in a container of liquid nitrogen. The sample is then removed and quickly snapped by bending using a pair of tweezers. Approximately 2 millimeter cut sample is fixed to a sample stub with conductive carbon paint (Structure Probe Inc. West Chester Pa.). Microscopy is done with an ISI-DS130c scanning electron microscope (International Scientific Instruments, Inc, Milpitas, Calif.). Digitized images are acquired by a slow scan frame grabber and stored in .TIF format.

EXAMPLE 1
Preparation of Porous Inner Diameter Skinned Asymmetric Hollow Fiber Membranes Hyflon® (POLY (PTFE-CO-PFVAE)) (Poly (PTFE-CO-PFVAE)) powder obtained from Ausimont USA, Inc., Thorofare, N.J., were mixed with HaloVac® 60 from Halocarbon Oil Inc, River edge, N.J. to produce a paste of 30% by weight polymer solids. The polymer/solvent paste mixture is introduced into a heated barrel of a twin screw Baker-Perkins (Saginaw, Mich.) extruder having 29 mm screws, by means of a Moyno (Springfield, Ohio) progressive cavity pump. The extruder barrel temperatures were set at between 180° C. and 300° C. A Zenith melt pump (Waltham, Mass.) was used to meter the melt into the special hollow fiber die mentioned above. The die annulus was approximately 300 microns. A low volume flow controller, Brooks Instrument 8744, (Hatfield, Pa.) fed air at controlled rate to maintain the hollow portion of the fiber. The melt pump and air pressure were adjusted to produce a fiber with about a 150 micron thick wall and a 540 micron diameter lumen at a spinning rate of 50 feet per minute. Mineral oil, maintained at 70° C., was used as the cooling bath. After centering the lumen, the die was operated in the horizontal submerged method. The fiber was taken up on a set of Godet rolls. The fiber was extracted with 1,1 dichloro-1-fluorethane, (Fluorocarbon 141b, ICI) and subsequently dried.

EXAMPLE 2
Preparation of Non-Porous Skinned Asymmetric Membranes

Ground pellets of Hyflon® (POLY (PTFE-CO-PFVAE)) (Poly (PTFE-CO-PFVAE)) obtained from Ausimont USA, Inc., Thorofare, N.J., were mixed with HaloVac® 60 from Halocarbon Oil Inc, River edge, N.J. to produce a paste of 40% by weight polymer solids. The polymer/solvent paste mixture is introduced into a heated barrel of a twin screw Baker-Perkins (Saginaw, Mich.) extruder having 29 mm screws. The extruder barrel temperatures were set at between 180° C. and 255° C. A Zenith melt pump (Waltham, Mass.) was used to meter the melt into the special hollow fiber die mentioned above. The die annulus was approximately 300 microns. A low volume flow controller, Brooks Instrument 8744, (Hatfield, Pa.) fed air at controlled rate to maintain the hollow portion of the fiber. The melt pump and air pressure were adjusted to produce a fiber with about a 250 micron thick wall and a 540 micron diameter lumen at a spinning rate of 100 feet per minute. Dioctyl pthalate, maintained at 35° C., was used as the cooling bath. After centering the lumen, the die was operated in the horizontal submerged method. The fiber was taken up on a set of Godet rolls. The fiber was extracted with 1,1-dichloro-1-fluorethane, (Genesolve 2000 Allied-Signal, NJ) and subsequently dried. The fibers had no observable IPA bubble point up to 100 psi, and no measurable IPA flow. These results indicate that the membrane skin was non-porous.

EXAMPLE 3
Production of Microporous Hollow Fiber Membranes

Pellets of Hyflon® POLY (PTFE-CO-PFVAE) 620 (Ausimont) was mixed with HaloVac 60 from Halocarbon Oil Inc. to produce a paste of 18% by weight, which was fed by a Moyno pump into a Baker-Perkins MPC/V-30; L/D=13 twin-screw extruder operating at 200 RPM in the horizontal fiber spinning mode. Extrusion and run conditions are shown in Tables 1 and 2 below. A Zenith melt pump was used to meter the melt into a hollow fiber die. The die annulus was about 400μ. Heated Halocarbon oil 1000N was used as lumen fluid to maintain the hollow portion of the fiber. The melt pump and the lumen fluid pump were adjusted to produce a fiber with about 200μ wall and 500μ lumen. The bath liquid was dioctyl pthalate. After centering of the lumen needle, the die was submerged under the quench liquid for about $\frac{1}{16}$" and the fiber was taken up by a set of Godet rolls. The fiber was extracted with Genesolv® 2000, Allied-Signal, Morristown, N.J., dried and then annealed at 275° C. Fiber Characterization data are given in Table 3.

TABLE 1

| Sample # | Extruder Barrel temperatures (° C.) | | | | Melt temperature (° C.) | Temperatures (° C.) | |
|---|---|---|---|---|---|---|---|
| | Zone 1 | Zone 2 | Zone 3 | Zone 4 | | Die body | Die Nose |
| 1 | 230 | 290 | 285 | 285 | 285 | 280 | 310 |
| 2 | 230 | 290 | 285 | 285 | 285 | 275 | 310 |
| 3 | 230 | 290 | 285 | 285 | 285 | 275 | 310 |
| 4 | 230 | 290 | 285 | 285 | 285 | 275 | 310 |
| 5 | 230 | 290 | 280 | 280 | 277 | 280 | 310 |
| 6 | 230 | 290 | 280 | 280 | 277 | 280 | 310 |
| 7 | 230 | 290 | 280 | 280 | 277 | 280 | 310 |
| 8 | 230 | 300 | 280 | 280 | 285 | 280 | 310 |

TABLE 2

| Sample # | Take-up rate (fpm) | Lumen pump rate (rpm) | Cooling bath Temperature (° C.) |
|---|---|---|---|
| 1 | 100 | 20 | 55 |
| 2 | 100 | 25 | 100 |
| 3 | 130 | 25 | 100 |
| 4 | 130 | 15 | 100 |
| 5 | 100 | 30 | 100 |
| 6 | 100 | 35 | 100 |
| 7 | 100 | 45 | 100 |
| 8 | 200 | 25 | 100 |

TABLE 3

| Sample # | Outer diameter Microns | Wall thickness microns | Visual IPA bubble point (psi) | Mean IPA bubble point (psi) | Flow Time (sec) |
|---|---|---|---|---|---|
| 1 | 940 | 191 | 16 | 39.5 | 1396 |
| 2 | 914 | 184 | 14 | 37.3 | 1028 |
| 3 | 826 | 165 | 15 | 37.6 | 916 |
| 4 | 749 | 210 | 19 | 40.5 | 1467 |
| 5 | 1054 | 178 | 14 | 27.3 | 933 |
| 6 | 1080 | 172 | 10.5 | 27.3 | 783 |
| 7 | 1118 | 140 | 10 | 37.9 | 788 |
| 8 | 826 | 203 | 12 | 29 | 1295 |

EXAMPLE 4
Contactor Used in Degassing Mode

Potting resin from Ausimont USA Inc, grade 940AX with a melting point of 256 C. and a melt flow index of about 200, was heated and melted at 275 C. in a heating cup about 4" wide and 3" deep. After about 24 hr, the resin was completely clear and it had no trapped bubbles. Degassing hollow fibers with 500μ ID and 150μ wall, made from 30% MFA 620 solids conc. and HaloVac 60, were used to prepare the fiber loops on a frame about 12" long. The fiber frames were extracted in Genesolv for about 24 hrs. The frames were retrieved, air dried, and then annealed at 280 C. for 24 hrs. The frames were retrieved from the oven, cooled and the fiber loops unwound from the frame. The fiber bundles were put back into the oven and annealed for another 24 hrs. The fiber bundles were retrieved and cooled. A bundle was then assembled with about 2000 fibers and they were inserted into a PFA housing about 10" long, 2" ID and a wall thickness of about ¼". The housing ends were pretreated and fused with MFA 904AX powdered resin. A depression was made with a rod in the potting cup. The housing and the fiber bundle are inserted into the cavity and were left there for 2 days. The potted fiber bundle was retrieved carefully and the housing reversed to treat the other end. After both ends were potted, the potting was cut to expose the lumens. The potted surfaces were then polished with a heat gun to remove any loose resins. The module was tested for integrity with IPA. It was found that one fiber had a defect. A solder gun was used to repair the module to plug both ends of the fiber. The module was tested again and was integral.

Fully saturated water was pumped through the lumen side of the module at a rate of 100 ml/min. A vacuum of 27" Hg was pulled on the shell-side. The temperature of the water was 20 C. An oxygen probe was used to measure the inlet and outlet oxygen concentration to determine the oxygen removal efficiency. At the outlet of the module, it was found that the oxygen level dropped from a saturated level of 8.5 ppm to 0.9 ppm in about 10–20 min. Thus, the removal efficiency was 89%.

EXAMPLE 5

Water Degassing

In this example, water is degassed using a membrane made in a manner similar to the membrane of Example 1. A bundle of fibers was made and potted in a cylindrical holder. The fiber ID was 500 μ and the fiber wall was about 150μ. The number of fibers was about 500 and the length of the module was about 20 cm. Water, at a temperature of 20 C., was pumped through the fiber lumens and a vacuum of 60 Torr was maintained on the shell side. The oxygen level of the water was measured at the inlet and outlet of the membrane. The inlet water was degassed to a level of 3.1 ppm using a Hoechst Liquid-Cell degasser. The pumping rate was 200 ml/min. and the temp. of water was 20 C. Air at atmospheric pressure was pumped into the shell-side. The airflow rate was about 2 standard liters per minute. The oxygen level at the outlet was observed to rise from 3.1 ppm to 6.8 ppm in a period of 10 min.

EXAMPLE 6

Measurement of Gasification Efficiency

The same module was used for gasification efficiency. In this mode, water at 20° C. was pumped through the lumen just as before, except that the feed water was degassed by a Hoechst Liquid Cel degasser. The shell side was purged with low-pressure air on one end, while the other end was left open. Because of the low gas flow, there was practically no gas pressure drop on the shell side.

For all practical purpose, the absolute gas pressure was assumed to be 760 mm Hg. The oxygen concentration of the feed and the outlet water was measured at different flow rates.

Figure 4:
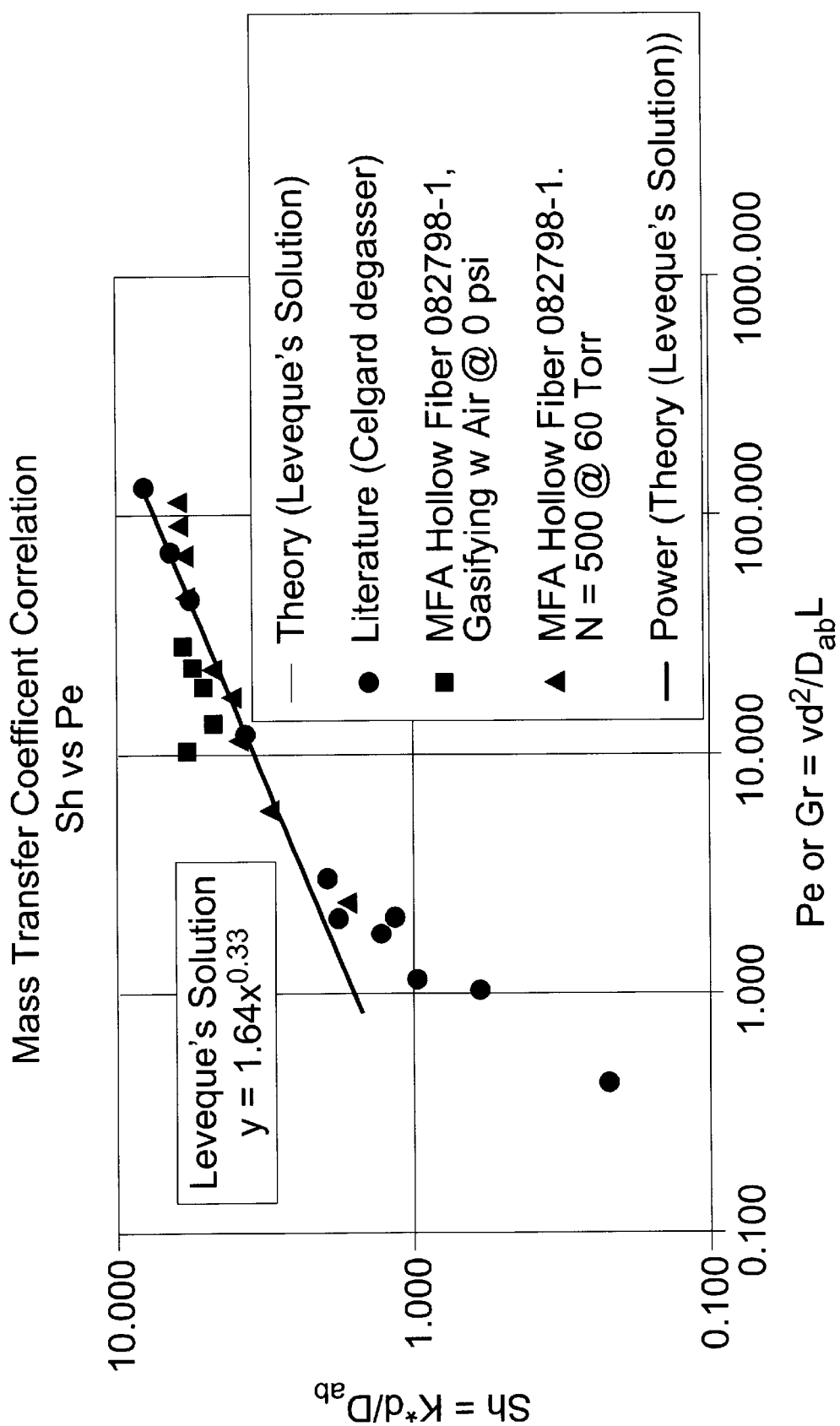
FIG. 4 shows the results of degassing tests run as described in Example 3.

FIG. 4 shows the results compared to literature values from product literature for Celgard Liquid Cel® degasser (Hoechst Celanese, Charlotte, N.C.) and theoretical predictions based on Leveque's solution. The method of data analysis is presented below.

The mass transfer coefficient, K, was calculated by the following equation:

$$K = -(Q/A)*\ln[C_{out}-C^*/C_{in}-C^*]$$

where $C_{out}$ is the oxygen conc. in output liquid [ppm]

$C_{in}$ is the oxygen conc. in input liquid [ppm]

$C^*$ is the equilibrium oxygen conc. at the gas pressure on the shell side [ppm]

Q is the flow rate [cc/s]

A is the membrane area [cm$^2$].

The Sherwood number is calculated as follows:

$$Sh = K*D/D_{ab}$$

where

K is the mass transfer coefficient [cm/s],

D is the ID of the fiber [cm] and $D_{ab}$ is the diffusivity of oxygen in water[cm$^2$/s].

The Graetz or Peclet number is calculated as follows:

$$Pe \text{ or } Gr = V*D^2/(L*D_{ab})$$

Where

V is the velocity of flow inside the lumen [cm/s] and

L is the length of the fiber [cm]

The Sherwood and Graetz numbers are dimensionless groups used to describe heat and mass transfer operations. The Sherwood number is a dimensionless mass transfer coefficient, and the Graetz number is a dimensionless group that is related to the inverse of the boundary layer thickness. Using the Leveque method, these dimensionless numbers can be correlated. In the linear region, as shown in FIG. 4, the relationship between the Sherwood number and the Graetz number is given as $Sh=1.64(Gr)^{0.33}$ for Graetz numbers from between about 5 to about 1000. The Leveque method is used to describe heat or mass transfer problems in tubes. In this method, the concentration boundary layer is assumed to be confined to a thin layer next to the wall of the tube. Yang and Cussier (AICHE J. 32 (11) 1910–1916 (1986)) used this method to correlate mass transfer coefficients for hollow fiber membrane contactors. For the case where the liquid was flowing inside the fibers, the Sherwood number followed the relation $Sh=A(Gr)^b$, where A=1.64 and the exponent b=0.33. For this case, they report a range for A as 1.62 to 1.86 from the literature. For liquid flow outside and in cross flow to the fibers, $Sh=C(Re)^d(Sc)^e$, where Re is the Reynolds number, dv/v, where d=fiber diameter, v=liquid velocity, v=kinematic viscosity, and Sc is the Schmidt number, the ratio of kinematic viscosity to the diffusion coefficient. C has a range of 0.32 to 1.38, d from 0.34 to 0.61 and e is 0.33.

S. R. Wickramasinghe et al (J. Membrane Sci. 69 (1992) 235–250) analyzed oxygen transport in a hollow fiber membrane contactor using the method of Leveque. A bundle of porous hollow fiber membranes were used. They showed that a plot of the Sherwood number vs. the Graetz number was linear at high values of the Graetz number, in agreement with theoretical predictions. Results at low Graetz number were explained by the polydisperity of fiber diameters, which affects uniformity of flow through the fibers. Their analysis showed that at low Graetz numbers, the average mass transfer coefficient falls below the theoretical prediction due to uneven flow through the fibers. They concluded that oxygen mass transfer was unaffected by the diffusional resistance across the membrane. Conversely, one can conclude that a membrane that follows the prediction of the Leveque theory is porous, because otherwise, the resistance to diffusion would be too high to follow the theory.

The results illustrated in FIG. 4 show that the membranes of this example behave as porous membranes because they follow the linear portion of the Leveque equation at high Peclet numbers.

EXAMPLE 7

Pore Intrusion Testing

An intrusion test was run on a membrane sample produced from a 30% polymer solids solution by a process similar to that described in Example 1. Fiber OD was 750 micron, ID was 485 micron. Isopropyl alcohol was used as the test fluid (surface tension 20.93 mN/m at 25° C.-CRC Handbook of Chemistry and Physics, CRC Press). At 50 psi, no intrusion was noted after 30 minutes. Some intrusion was noted at 60 psi.

EXAMPLE 8

Preparation of Asymmetric Skinned Perfluorinated Thermoplastic Hollow Fiber Membrane with Outside Diameter Skinned An asymmetric microporous poly (tetrafluoroethylene-co-perfluoro methyl vinyl ether) ((POLY (PTFE-CO-PFVAE))) hollow fiber membrane with a skinned outside surface was prepared by the following method:

A slurry mixture of 16% (w/w) of powder (POLY (PTFE-CO-PFVAE)) (Hyflon™ (POLY (PTFE-CO-PFVAE)) 620 from Ausimont) in chlorotrifluoroethylene oligomer (CTFE) (Halocarbon Oil #60 from Halocarbon Products) was prepared at room temperature and used for hollow fiber extrusion. This slurry was fed via a metering pump (FMI model QV) into an extrusion system consisting of a twin-screw extruder (Baker-Perkins model MPC/V-30, L/D=13), a melt pump (Zenith model HPB 5704), a melt filter and a hollow fiber die. The twin screws inside the extruder were configured with feed screw elements and mixing paddles to provide capability for mixing and conveying of the (POLY (PTFE-CO-PFVAE))/CTFE melt blend. The screw speed used was 200 rpm. The hollow fiber die in this system has an inner diameter opening of 0.016 in. and an annular gap of 0.017 in. Pure CTFE oil (same grade as in the slurry) was metered into the center channel of the die via a metering pump (Zenith model FF 7298) and it functioned as the lumen filling fluid for the hollow fiber during formation. The temperature set points for the various zones of the extrusion system ranged from 230° to 305° C. The melt pump's output rate during this experiment was approximately 20 g/min and the lumen oil's feed rate was approximately 10 g/min.

The melt blend in the form of a lumen oil filled fiber was extruded in a horizontal direction into a quench bath containing re-circulating mineral oil (Britol 35 from Witco) functioning as the quench fluid. The temperature of the oil was maintained at approximately 73° C. by use of external heating. An air gap of approximately 0.25 in. was maintained between the tip of the hollow fiber die and the entrance into the quench bath. The quenched fiber was wound around a set of Godet rolls and taken up at a linear speed of 120 fpm. This gel fiber with the oil filled lumen has an OD~800µ and ID~400µ.

To remove the CTFE oil from the quenched fiber, a length of the fiber sample was wrapped in multiple loops around an open rectangular metal frame and clamped at both ends. The frame was placed in a degreaser (Baron Blakeslee MLR-LE) containing 1,1 dichloro-1-fluoroethane (Fluorocarbon 141b, ICI) for approximately 16 hrs. Afterwards, the framed sample was allowed to dry at room temperature and it was then heat-set in an oven at 275° C. for approximately 10 mins.

A practitioner skilled in the art of developing and producing hollow fiber membranes will be able to discern the advantages of the present invention. It is not the intent of the discussion of the present invention to exhaustively present all combinations, substitutions or modifications that are possible, but to present representative methods for the edification of the skilled practitioner. Representative examples have been given to demonstrate reduction to practice and are not to be taken as limiting the scope of the present invention. The inventor seeks to cover the broadest aspects of the invention in the broadest manner known at the time the claims were made.

What we claim:

1. A fluid-fluid phase contactor substantially made from perfluorinated thermoplastic polymers for contacting a first fluid with a second fluid comprising;

a) a bundle of a plurality of perfluorinated thermoplastic hollow fiber membranes having a first end and a second end, said membranes having an outer surface and an inner surface, said inner surface comprising a lumen, said membranes selected from the group consisting of hollow fiber membranes having a porous skinned inner surface, a porous outer surface, and a porous support structure between, hollow fiber membranes having a non-porous skinned inner surface, a porous outer surface, and a porous support structure between, and hollow fiber membranes having a porous skinned outer surface, a porous inner surface, and a porous support structure between, and hollow fiber membranes having a non-porous skinned outer surface, a porous inner surface, and a porous support, structure between, b) each end of said bundle potted with a liquid tight perfluorinated thermoplastic seal forming a unitary end structure with a surrounding perfluorinated thermoplastic housing wherein the fiber ends are open to fluid flow, c) said housing having an inner wall and an outer wall wherein the inner wall defines a fluid flow volume between the inner wall and the outer surfaces of the hollow fiber membranes, d) said housing having a first fluid inlet to supply a first fluid to said first end of the bundle to be contacted with a second fluid and a first fluid outlet connection to remove said contacted first fluid from said second end, e) said housing having a second fluid inlet connection to supply a second fluid to be contacted with said first fluid to said volume formed between the inner wall of the housing and the outer surfaces of the hollow fiber membranes, and a second outlet connection to remove said contacted second fluid.

2. The contactor of claim 1 having hollow fiber membrane outer diameter in the range of from about 350 microns to about 1450 microns.

3. The contactor of claim 1 wherein the porous skinned surface pores are in the range of 0.001 micron to about 0.05 micron.

4. The contactor of claim 1 wherein in paragraph b) said each end of said bundle is potted with a liquid tight perfluorinated thermoplastic seal forming a single unitary end structure comprising both the first fiber bundle end and the second fiber bundle end with a surrounding perfluorinated thermoplastic housing wherein the fibers of said each end are separately open to fluid flow.

5. The contactor of any one of the claims 1, 2, 3 or 4 capable of liquid-gas mass transfer with liquid flow in the lumen with a Sherwood number equal to the Graetz number to the 0.33 power multiplied by a factor A, wherein A is in the range of from about 1.62 to about 1.86, in a range of Graetz numbers of from about 5 to about 1000.

6. The contactor of any one of the claims 1, 2, 3 or 4 capable of liquid-gas mass transfer with liquid flow in the lumen with a Sherwood number equal to about 1.64 multiplied by the Graetz number to the 0.33 power in a range of from about 5 to about 1000.

7. The contactor of any one of the claims 1, 2, 3 or 4 capable of liquid-gas mass transfer with liquid flow across the outer surface of said hollow fiber membranes with a Sherwood number equal to a factor C multiplied by the Reynolds number raised to the d power, multiplied by the Schmidt number raised to the e power, where c lies in the range of from about 0.32 to about 1.38, d lies in the range of from about 0.34 to about 0.61 and e is about 0.33.

8. The contactor of any one of the claims 1, 2, 3 or 4 capable of liquid-gas mass transfer with liquids having surface tension values of greater than about 20 mN/m.

9. The contactor of any one of the claims 1, 2, 3 or 4 capable of liquid-gas mass transfer having an intrusion pressure of less than about 60 psi with isopropyl alcohol.

10. A method of effecting contact, utilizing the contactor of any one of claims 1, 2, 3 or 4 of said first fluid with said second fluid which comprises passing said first fluid from said first fluid inlet to said first fluid outlet and passing said second fluid from said second fluid inlet to said second fluid outlet wherein the first fluid is a liquid and the second fluid is a gas.

11. The method of claim 10 wherein the first fluid is an aqueous liquid and the second fluid is an ozone containing gas mixture.

12. A method of effecting contact utilizing the contactor of any one of claims 1, 2, 3 or 4 of said first fluid with said second fluid which comprises passing said first fluid from said first fluid inlet to said first fluid outlet and passing said second fluid from said second fluid inlet to said second fluid outlet wherein the first fluid is a gas and the second fluid is a liquid.

13. A method of utilizing the contactor of claim 12 wherein the first fluid is an ozone containing gas mixture and the second fluid is an aqueous liquid.

14. A fluid-fluid phase contactor made from perfluorinated thermoplastic polymers for contacting a first fluid with a second fluid comprising;
  a) a bundle having a first end and a second end of a plurality of microporous perfluorinated thermoplastic hollow fiber membranes, said membranes having an inner surface and an outer surface,
  b) each end of said bundle potted with a liquid tight perfluorinated thermoplastic seal forming a unitary end structure with a surrounding perfluorinated thermoplastic housing wherein the fiber ends are open to fluid flow,
  c) said housing having an inner wall and an outer wall wherein the inner wall defines a fluid flow volume between the inner wall and the outer surfaces of the hollow fiber membranes,
  d) said housing having a first fluid inlet to supply a first fluid to said first end of the bundle to be contacted with a second fluid and a first fluid outlet connection to remove said contacted first fluid from said second end,
  e) said housing having a second fluid inlet connection to supply a second fluid to be contacted with said first fluid to said volume formed between the inner wall of the housing and of the outer surfaces of the hollow fiber membranes, and a second outlet connection to remove said contacted second fluid.

15. A method of making a fluid-fluid phase contactor substantially made from perfluorinated thermoplastic polymers for contacting a first fluid with a second fluid, comprising;
  a) forming a bundle of a plurality of perfluorinated thermoplastic hollow fiber membranes having a first end and a second end, said membranes having an outer surface and an inner surface, said inner surface comprising a lumen, said membranes selected from the group consisting of
    hollow fiber membranes having a porous skinned inner surface, a porous outer surface, and a porous support-structure between,
    hollow fiber membranes having a non-porous skinned inner surface, a porous outer surface, and a porous support structure between,
    hollow fiber membranes having a porous skinned outer surface, a porous inner surface, and a porous support structure between,
    and hollow fiber membranes having a non-porous skinned outer surface, a porous inner surface, and a porous support structure between,
  b) positioning said fiber bundle in a surrounding perfluorinated thermoplastic housing having an inner wall and an outer wall to form a fluid flow volume between the inner wall and the outer surfaces of the hollow fiber membranes,
  c) potting each end of said bundle positioned in said housing with a liquid tight perfluorinated thermoplastic seal to form a unitary end structure with said surrounding perfluorinated thermoplastic housing,
  d) opening the fiber ends of both unitary end structures to provide fluid flow through the hollow fiber lumens,
  e) providing said housing with a first fluid inlet to supply a first fluid to said first end of the bundle to be contacted with a second fluid and a first fluid outlet connection to remove said contacted first fluid from said second end,
  f) providing said housing with a second fluid inlet connection to supply a second fluid to be contacted with said first fluid to said volume formed between the inner wall of the housing and the outer surfaces of the hollow fiber membranes, and an second outlet connection to remove said contacted second fluid.

16. The method of claim 15 wherein wherein in paragraph c) said each end of said bundle is potted with a liquid tight perfluorinated thermoplastic seal forming a single unitary end structure comprising both the first fiber bundle end and the second fiber bundle end with a surrounding perfluorinated thermoplastic housing wherein the fibers of said each end are separately open to fluid flow.

17. The method of claim 15 or 16 wherein a step is added after step d) comprising repairing potting defects by melting said potting material locally near the defect to seal said defect.

18. A fluid-fluid phase contactor substantially made from perfluorinated thermoplastic polymers for contacting a first fluid with a second fluid produced by the process of claim 17 comprising:

a) a bundle of a plurality of perfluorinated thermoplastic hollow fiber membranes having a first end and a second end, said membranes having an outer surface and an inner surface comprising a lumen, said membranes selected from the group consisting of hollow fiber membranes having a porous skinned inner surface, a porous outer surface, and a porous support structure between;

hollow fiber membranes having a non-porous skinned inner surface, a porous outer surface, and a porous support structure between;

hollow fiber membranes having a porous skinned outer surface, a porous inner surface, and a porous support structure between;

and hollow fiber membranes having a non-porous skinned outer surface, a porous inner surface, and a porous support structure between, b) each end of said bundle potted with a liquid tight perfluorinated thermoplastic seal forming a unitary end structure with a surrounding perfluorinated thermoplastic housing wherein the fiber ends are open to fluid flow, c) said housing having an inner wall and an outer wall wherein the inner wall defines a fluid flow volume between the inner wall and the hollow fiber membranes, d) said housing having a first fluid inlet to supply a first fluid to said first end of the bundle to be contacted with a second fluid and a first fluid outlet connection to remove said contacted first fluid from said second end, e) said housing having a second fluid inlet connection to supply a second fluid to be contacted with said first fluid to said volume formed between the inner wall of the housing and the hollow fiber membranes, and a second outlet connection to remove said contacted second fluid.

19. The contactor of claim 18 wherein in paragraph b) said each end of said bundle is potted with a liquid tight perfluorinated thermoplastic seal forming a single unitary end structure comprising both the first fiber bundle end and the second fiber bundle end with a surrounding perfluorinated thermoplastic housing wherein the fibers of said each end are separately open to fluid flow.

20. The contactor of claim 19 having a hollow fiber membrane outer diameter in the range of from about 350 microns to about 1450 microns.

21. The contactor of claim 19 wherein the pores are in the range of 0.001 micron to about 0.05 micron.

22. The contactor of claim 18 having a hollow fiber membrane outer diameter in the range of from about 350 microns to about 1450 microns.

23. The contactor of claim 18 wherein the pores are in the range of 0.001 micron to about 0.05 micron.

24. The contactor of claim 18 capable of liquid-gas mass transfer with liquid flow in the lumen with a Sherwood number equal to the Graetz number to the 0.33 power multiplied by a factor A, wherein A is in the range of from about 1.62 to about 1.86, in a range of Graetz numbers of from about 5 to about 1000.

25. The contactor of claim 18 capable of liquid-gas mass transfer with liquid flow in the lumen with a Sherwood number equal to about 1.64 multiplied by the Graetz number to the 0.33 power in a range of Graetz numbers of from about 5 to about 1000.

26. The contactor of claim 18 capable of liquid-gas mass transfer with liquid flow across the outer surface of said hollow fiber membranes with a Sherwood number equal to a factor C multiplied by the Reynolds number raised to the d power, multiplied by the Schmidt number raised to the e power, where c lies in the range of from about 0.32 to about 1.38, d lies in the range of from about 0.34 to about 0.61, and e is about 0.33.

27. The contactor of claim 18 capable of liquid-gas mass transfer with liquids having surface tension values of greater than about 20 mN/m.

28. The contactor of claim 18 capable of liquid-gas mass transfer having an intrusion pressure of less than about 60 psi with isopropyl alcohol.

29. A fluid-fluid phase contactor substantially made from perfluorinated thermoplastic polymers for contacting a first fluid with a second fluid produced by the process of any one of claims 15 or 16 comprising;

a) a bundle of a plurality of perfluorinated thermoplastic hollow fiber membranes having a first end and a second end, said membranes having an outer surface and an inner surface, said inner surface comprising a lumen, said membranes selected from the group consisting of hollow fiber membranes having a porous skinned inner surface, a porous outer surface, and a porous support structure between, hollow fiber membranes having a non-porous skinned inner surface, a porous outer surface, and a porous support structure between, hollow fiber membranes having a porous skinned outer surface, a porous inner surface, and a porous support structure between, and hollow fiber membranes having a non-porous skinned outer surface, a porous inner surface, and a porous support structure between, b) each end of said bundle potted with a liquid tight perfluorinated thermoplastic seal forming a unitary end structure with a surrounding perfluorinated thermoplastic housing wherein the fiber ends are open to fluid flow, c) said housing having an inner wall and an outer wall wherein the inner wall defines a fluid flow volume between the inner wall and the outer surfaces of the hollow fiber membranes, d) said housing having a first fluid inlet to supply a first fluid to said first end of the bundle to be contacted with a second fluid and a first fluid outlet connection to remove said contacted first fluid from said second end, e) said housing having a second fluid inlet connection to supply a second fluid to be contacted with said first fluid to said volume formed between the inner wall of the housing and the outer surfaces of the hollow fiber membranes, and a second outlet connection to remove said contacted second fluid.

30. The contactor of claim 29 wherein in paragraph b) said each end of said bundle is potted with a liquid tight perfluorinated thermoplastic seal forming a single unitary end structure comprising both the first fiber bundle end and the second fiber bundle end with a surrounding perfluorinated thermoplastic housing wherein the fibers of said each end are separately open to fluid flow.

31. The contactor of claim 30 having a hollow fiber membrane outer diameter in the range of from about 350 microns to about 1450 microns.

32. The contactor of claim 31 capable of liquid-gas mass transfer with liquid flow in the lumen with a Sherwood number equal to the Graetz number to the 0.33 power multiplied by a factor A, wherein A is in the range of from about 1.62 to about 1.86, in a range of Graetz numbers of from about 5 to about 1000.

33. The contactor of claim 31 capable of liquid-gas mass transfer with liquid flow in the lumen with a Sherwood number equal to about 1.64 multiplied by the Graetz number to the 0.33 power in a range of Graetz numbers of from about 5 to about 1000.

34. The contactor of claim 31 capable of liquid-gas mass transfer with liquid flow across the outer surface of said hollow fiber membranes with a Sherwood number equal to a factor C multiplied by the Reynolds number raised to the d power, multiplied by the Schmidt number raised to the e power, where c lies in the range of from about 0.32 to about 1.38, d lies in the range of from about 0.34 to about 0.61, and e is about 0.33.

35. The contactor of claim 31 capable of liquid-gas mass transfer with liquids having surface tension values of greater than about 20 mN/m.

36. The contactor of claim 31 capable of liquid-gas mass transfer having an intrusion pressure of less than about 60 psi with isopropyl alcohol.

37. A method of using the contactor of claim 31 which comprises supplying a liquid to the first fluid inlet and a gas to the second fluid inlet.

38. A method of using the contactor of claim 31 which comprises supplying a gas to the first fluid inlet and a liquid to the second fluid inlet.

39. The contactor of claim 30 wherein the pores are in the range of 0.001 micron to about 0.05 micron.

40. The contactor of claim 39 capable of liquid-gas mass transfer with liquid flow in the lumen with a Sherwood number equal to the Graetz number to the 0.33 power multiplied by a factor A, wherein A is in the range of from about 1.62 to about 1.86, in a range of Graetz numbers of from about 5 to about 1000.

41. The contactor of claim 39 capable of liquid-gas mass transfer with liquid flow in the lumen with a Sherwood number equal to about 1.64 multiplied by the Graetz number to the 0.33 power in a range of Graetz numbers of from about 5 to about 1000.

42. The contactor of claim 39 capable of liquid-gas mass transfer with liquid flow across the outer surface of said hollow fiber membranes with a Sherwood number equal to a factor C multiplied by the Reynolds number raised to the d power, multiplied by the Schmidt number raised to the e power, where c lies in the range of from about 0.32 to about 1.38, d lies in the range of from about 0.34 to about 0.61, and e is about 0.33.

43. The contactor of claim 39 capable of liquid-gas mass transfer with liquids having surface tension values of greater than about 20 mN/m.

44. The contactor of claim 39 capable of liquid-gas mass transfer having an intrusion pressure of less than about 60 psi with isopropyl alcohol.

45. A method of using the contactor of claim 39 which comprises supplying a liquid to the first fluid inlet and a gas to the second fluid inlet.

46. A method of using the contactor of claim 39 which comprises supplying a gas to the first fluid inlet and a liquid to the second fluid inlet.

47. The contactor of claim 30 capable of liquid-gas mass transfer with liquid flow in the lumen with a Sherwood number equal to the Graetz number to the 0.33 power multiplied by a factor A, wherein A is in the range of from about 1.62 to about 1.86, in a range of Graetz numbers of from about 5 to about 1000.

48. the contactor of claim 30 capable of liquid-gas mass transfer with liquid flow in the lumen with a Sherwood number equal to about 1.64 multiplied by the Graetz number to the 0.33 power in a range of Graetz numbers fo from about 5 to about 1000.

49. The contactor of claim 30 capable of liquid-gas mass transfer with liquid flow across the outer surface of said hollow fiber membranes with a Sherwood number equal to a factor C multiplied by the Reynolds number raised to the d power, multiplied by the Schmidt number raised to the e power, where c lies in the range of from about 0.32 to about 1.38, d lies in the range of from about 0.34 to about 0.61, and e is about 0.33.

50. The contactor of claim 30 capable of liquid-gas mass transfer with liquids having surface tension values of greater than about 20 mN/m.

51. The contactor of claim 30 capable of liquid-gas mass transfer having an intrusion pressure of less than about 60 psi with isopropyl alcohol.

52. A method of using the contactor of claim 30 wherein the first fluid is a liquid to the first fluid inlet and the second fluid is a gas.

53. A method of using the contactor of claim 30 which comprises supplying a gas to the first fluid inlet and a liquid to the second fluid inlet.

54. The contactor of claim 29 having a hollow fiber membrane outer diameter in the range of from about 350 microns to about 1450 microns.

55. The contactor of claim 54 capable of liquid-gas mass transfer with liquid flow in the lumen with a Sherwood number equal to the Graetz number to the 0.33 power multiplied by a factor A, wherein A is in the range of from about 1.62 to about 1.86, in a range of Graetz numbers of from about 5 to about 1000.

56. The contactor of claim 54 capable of liquid-gas mass transfer with liquid flow in the lumen with a Sherwood number equal to about 1.64 multiplied by the Graetz number to the 0.33 power in a range of Graetz numbers of from about 5 to about 1000.

57. The contactor of claim 54 capable of liquid-gas mass transfer with liquid flow across the outer surface of said hollow fiber membranes with a Sherwood number equal to a factor C multiplied by the Reynolds number raised to the d power, multiplied by the Schmidt number raised to the e power, where c lies in the range of from about 0.32 to about 1.38, d lies in the range of from about 0.34 to about 0.61, and e is about 0.33.

58. The contactor of claim 54 capable of liquid-gas mass transfer with liquids having surface tension values of greater than about 20 mN/m.

59. The contactor of claim 54 capable of liquid-gas mass transfer having an intrusion pressure of less than about 60 psi with isopropyl alcohol.

60. A method of using the contactor of claim 54 thich comprises supplying is a liquid to the first fluid inlet and a gas to the second fluid inlet.

61. A method of using the contactor of claim 54 which comprises supplying a gas to the first fluid inlet and a liquid to the second fluid inlet.

62. The contactor of claim 29 wherein the pores are in the range of 0.001 micron to about 0.05 micron.

63. The contactor of claim 62 capable of liquid-gas mass transfer with liquid flow in the lumen with a Sherwood number equal to the Graetz number to the 0.33 power multiplied by a factor A, wherein A is in the range of from about 1.62 to about 1.86, in a range of Graetz numbers of from,i about 5 to about 1000.

64. The contactor of claim 62 capable of liquid-gas mass transfer with liquid flow in the lumen with a Sherwood number equal to about 1.64 multiplied bythe Graetz number to the 0.33 power in a range of Graetz numbers of from about 5 to about 1000.

65. The contactor of claim 62 capable of liquid-gas mass transfer with liquid flow across the outer surface of said hollow fiber membranes with a Sherwood number equal to a factor C multiplied by the Reynolds number raised to the d power, multiplied by the Schmidt number raised to the e power, where c lies in the range of from about 0.32 to about 1.38, d lies in the range of from about 0.34 to about 0.61, and e is about 0.33.

66. The contactor of claim 62 capable of liquid-gas mass transfer with liquids having surface tension values of greater than about 20 mN/m.

67. The contactor of claim 62 capable of liquid-gas mass transfer having an intrusion pressure of less than about 60 psi with isopropyl alcohol.

68. A method of using the contactor of claim 62 which comprises supplying a liquid to the first fluid inlet and a gas to the second fluid inlet.

69. A method of using the contactor of claim 62 which comprises supplying a gas to the first fluid inlet and a liquid to the second fluid inlet.

70. The contactor of claim 29 capable of liquid-gas mass transfer with liquid flow in the lumen with a Sherwood number equal to the Graetz number to the 0.33 power multiplied by a factor A, wherein A is in the range of from about 1.62 to about 1.86, in a range of Graetz numbers of from about 5 to about 1000.

71. A method of using the contactor of claim 70 which comprises supplying a liquid to the first fluid inlet and a gas to the second fluid inlet.

72. A method of using the contactor of claim 70 which comprises supplying a gas to the first fluid inlet and a liquid to the second fluid inlet.

73. The contactor of claim 29 capable of liquid-gas mass transfer with liquid flow in the lumen with a Sherwood number equal to about 1.64 multiplied by the Graetz number to the 0.33 power in a range of Graetz numbers of from about 5 to about 1000.

74. A method of using the contactor of claim 73 which comprises supplying a liquid to the first fluid inlet and a gas to the second fluid inlet.

75. A method of using the contactor of claim 73 which comprises supplying a gas to the first fluid inlet and a liquid to the second fluid inlet.

76. The contactor of claim 29 capable of liquid-gas mass transfer with liquid flow across the outer surface of said hollow fiber membranes with a Sherwood number equal to a factor C multiplied by the Reynolds number raised to the d power, multiplied by the Schmidt number raised to the e power, where c lies in the range of from about 0.32 to about 1.38, d lies in the range of from about 0.34 to about 0.61, and e is about 0.33.

77. A method of using the contactor of claim 76 which comprises supplying a liquid to the first fluid inlet and a gas to the second fluid inlet.

78. A method of using the contactor of claim 76 which comprises supplying a gas to the first fluid inlet and a liquid to the second fluid inlet.

79. The contactor of claim 29 capable of liquid-gas mass transfer with liquids having surface tension values of greater than about 20 mN/m.

80. A method of using the contactor of claim 79 which comprises supplying a liquid to the first fluid inlet and a gas to the second fluid inlet.

81. A method of using the contactor of claim 79 which comprises supplying a gas to the first fluid inlet and a liquid to the second fluid inlet.

82. The contactor of claim 29 capable of liquid-gas mass transfer having an intrusion pressure of less than about 60 psi with isopropyl alcohol.

83. A method of using the contactor of claim 82 which comprises supplying a liquid to the first fluid inlet and a gas to the second fluid inlet.

84. A method of using the contactor of claim 82 which comprises supplying a gas to the first fluid inlet and a liquid to the second fluid inlet.

85. A method of using the contactor of claim 29 wherein the first fluid is a liquid and the second fluid is a gas.

86. A method of using the contactor of claim 85 wherein the gas is an ozone containing gas mixture and the liquid is an aqueous liquid.

87. A method of using the contactor of claim 29 wherein the first fluid is a gas and the second fluid is a liquid.

88. A method of using the contactor of claim 87 wherein the gas is an ozone containing gas mixture and the liquid is an aqueous liquid.

89. A method of using the contactor of claim 29, which comprises supplying a liquid to the first fluid inlet and a gas to the second fluid inlet.

90. A method of claim 89 wherein the first fluid is an ozone containing gas mixture and the second fluid is an aqueous liquid.

91. A method of using the contactor of claim 29, which comprises supplying a gas to the first fluid inlet and a liquid to the second fluid inlet.

92. A method of using the contactor of claim 91 wherein the first fluid is an aqueous liquid and said second fluid is an ozone containing gas mixture.

93. The method of claim 29 wherein a step for repairing defects is added after step d) comprising repairing potting defects by melting said potting material locally near the defect to seal the defect.

94. A fluid-fluid phase contactor substantially made from perfluorinated thermoplastic polymers for contacting a first fluid with a second fluid produced by the method of claim 93 comprising:
   a) a bundle having a first end and a second end of a plurality of microporous perfluorinated thermoplastic hollow fiber membranes, said membranes having an inner surface and an outer surface,
   b) each end of said bundle potted with a liquid tight perfluorinated thermoplastic seal forming a unitary end structure with a surrounding perfluorinated thermoplastic housing wherein the fiber ends are open to fluid flow,
   c) said housing having an inner wall and an outer wall wherein the inner wall defines a fluid flow volume between said inner wall and the hollow fiber membranes,
   d) said housing having a first fluid inlet to supply a first fluid to said first end of the bundle to be contacted with a second fluid and a first fluid outlet connection to remove said contacted first fluid from said second end,
   e) said housing having a second fluid inlet connection to supply a second fluid to be contacted with said first fluid to said volume formed between the inner wall of the housing and the hollow fiber membranes, and a second outlet connection to remove said contacted second fluid.

95. A method of using the contactor of claim 94 which comprises supplying a liquid to said first end and supplying a gas to said second end.

96. A method of using the contactor of claim 95 wherein the gas is an ozone containing gas mixture and the liquid is an aqueous liquid.

97. A method of using the contactor of claim 94 which comprises supplying a liquid to said second end and supplying a gas to said first end.

98. A method of claim 97 wherein the gas is an ozone containing gas mixture and the liquid is an aqueous liquid.

99. A contactor of claim 29 wherein said perfluorinated thermoplastic is selected from the group consisting of poly (tetraethylene-co-perfluoro (alkylvinylether)) and poly (tetrafluoroethylene-co-hexafluoropropylene.

100. A method of making a fluid-fluid phase contactor made from perfluorinated thermoplastic polymers for contacting a first fluid with a second fluid, comprising;
   a) forming a bundle of a plurality of perfluorinated thermoplastic microporous hollow fiber membranes, said membranes having an inner surface and an outer surface, said bundle having a first and a second end and being in a substantially cylindrical form,
   b) positioning said fiber bundle in a surrounding perfluorinated thermoplastic housing having an inner wall and an outer wall to form a fluid flow volume between said inner wall and the outer surfaces of the hollow fiber membranes,
   c) potting each end of said bundle positioned in said housing with a liquid tight perfluorinated thermoplastic seal to form a unitary end structure with said surrounding perfluorinated thermoplastic housing, opening the fiber ends of both unitary end structures to provide fluid flow through the hollow fiber lumens,
   d) providing said housing with a first fluid inlet to supply a first fluid to said first end of the bundle to be contacted with a second fluid and a first fluid outlet connection to remove said contacted first fluid from said second end,
   e) providing said housing with a second fluid inlet connection to supply a second fluid to be contacted with said first fluid to said volume formed between the inner wall of the housing and the outer surfaces of the hollow fiber membranes, and a second outlet connection to remove said contacted second fluid.

101. A fluid-fluid phase contactor made from perfluorinated thermoplastic polymers for contacting a first fluid with a second fluid produced by the process of claim 100 comprising;
   a) a bundle having a first end and a second end of a plurality of microporous perfluorinated thermoplastic hollow fiber membranes, said membranes having an inner surface and an outer surface,
   b) each end of said bundle potted with a liquid tight perfluorinated thermoplastic seal forming a unitary end structure with a surrounding perfluorinated thermoplastic housing wherein the fiber ends are open to fluid flow,
   c) said housing having an inner wall and an outer wall wherein the inner wall defines a fluid flow volume between said inner wall and the outer surfaces of the hollow fiber membranes,
   d) said housing having a first fluid inlet to supply a first fluid to said first end of the bundle to be contacted with a second fluid and a first fluid outlet connection to remove said contacted first fluid from said second end,
   e) said housing having a second fluid inlet connection to supply a second fluid to be contacted with said first fluid to said volume formed between the inner wall of the housing and the outer surfaces of the hollow fiber membranes, and a second outlet connection to remove said contacted second fluid.

102. A method of using the contactor of claim 101 which comprises supplying a liquid to said first end of the bundle and supplying a gas to the second end of the bundle.

103. A method of using the contactor of claim 102 wherein the gas is an ozone containing gas mixture and the liquid is an aqueous liquid.

104. A method of using the contactor of claim 101 which comprises supplying a gas to said first end of the bundle and supplying liquid to the second end of the bundle.

105. A method of using the contactor of claim 104 wherein the gas is an ozone containing gas mixture and the liquid is an aqueous liquid.

106. A contactor of any one of the claims 1, 15, 100 or 101 wherein said perfluorinated thermoplastic is selected from the group consisting of poly (tetraethylene-co-perfluoro (alkylvinylether)) and poly (tetrafluoroethylene-co-hexafluoropropylene.

107. The membrane of claim 106 wherein the alkyl of said poly(tetrafluoroethylene-co-perfluoro(alkylvinylether)) is selected from the group consisting of propyl, methyl, and blends of methyl and propyl.

* * * * *